(12) United States Patent
Kunikiyo

(10) Patent No.: US 6,762,477 B2
(45) Date of Patent: Jul. 13, 2004

(54) SEMICONDUCTOR DEVICE

(75) Inventor: Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 21 days.

(21) Appl. No.: 10/191,469

(22) Filed: Jul. 10, 2002

(65) Prior Publication Data

US 2002/0175375 A1 Nov. 28, 2002

Related U.S. Application Data

(62) Division of application No. 09/607,560, filed on Sep. 22, 2000, now abandoned.

(30) Foreign Application Priority Data

Mar. 24, 2000 (JP) ................................ P2000-084350

(51) Int. Cl.[7] .......................... H01L 29/00; H01L 29/76; H01L 29/94; H01L 31/062; H01L 31/113
(52) U.S. Cl. ...................... 257/506; 257/396; 257/398; 257/501; 257/510
(58) Field of Search ................................ 257/394–400, 257/500–501, 506, 510

(56) References Cited

U.S. PATENT DOCUMENTS

| | | | | |
|---|---|---|---|---|
| 5,594,270 A | * | 1/1997 | Hiramoto et al. | ........... 257/393 |
| 5,652,454 A | | 7/1997 | Iwamatsu et al. | |
| 5,973,364 A | | 10/1999 | Kawanaka | |
| 6,110,769 A | | 8/2000 | Son | |
| 6,133,608 A | | 10/2000 | Flaker et al. | |
| 6,303,441 B1 | | 10/2001 | Park et al. | |
| 6,314,021 B1 | | 11/2001 | Maeda et al. | |
| 6,320,225 B1 | | 11/2001 | Hargrove et al. | |
| 6,429,487 B1 | | 8/2002 | Kunikiyo | |
| 6,462,379 B2 | | 10/2002 | Higashi et al. | |

FOREIGN PATENT DOCUMENTS

| | | | | |
|---|---|---|---|---|
| CN | 1236999 | 12/1999 | | |
| DE | 199 62 053 | 7/2000 | | |
| EP | 0 989 613 | 3/2000 | | |
| JP | 58-124243 | 7/1983 | | |
| JP | 358124243 A | 7/1983 | | |
| JP | 7-66284 | 3/1995 | | |
| JP | 11-261037 | 9/1999 | | |
| JP | 11-284146 | * 10/1999 | ......... H01L/27/108 | |

OTHER PUBLICATIONS

S. Krishnan, Proceedings 1997 IEEE International SOI Conference, pp. 140–141, "Efficacy of Body Ties Under Dynamic Switching Conditions in Partially Depleted SOI CMOS Technology", Oct. 1997.

J.A. Mandelman, et al., Proceedings 1997 IEEE International SOI Conference, pp. 164–165, "SOI MOSFET Mismatch Due to Floating–Body Effects", Oct. 1997.

Y–H. Koh, et al., Proceedings 1997 IEEE International SOI Conference, pp. 170–171, "64Mbit SOI–DRAM Technologies Using Body–Contacted (BC) Structure", Oct. 1997.

* cited by examiner

Primary Examiner—Shouxiang Hu
(74) Attorney, Agent, or Firm—Oblon, Spivak, McCelland, Maier & Neustadt, P.C.

(57) ABSTRACT

Provided is a semiconductor device using an SOI substrate which can suppress a leakage current with the potential of a channel formation region fixed. Specifically, by an FTI (26) an SOI substrate (14) is divided into a PMOS formation region and an NMOS formation region. The FTI (26) extends from the upper surface of a silicon layer (17) to the upper surface of a BOX layer (16). A body contact region (9) is selectively formed in an upper surface of the silicon substrate (14). The body contact region (9) and a channel formation region (4p) are isolated from each other, by a PTI (31). An N+ type channel stopper layer (30) is formed in the portion of the silicon layer (14) which is sandwiched between the bottom surface of the PTI (31) and the upper surface of the BOX layer (16). The body contact region (9) and the channel formation region (4p) are electrically connected to each other, through the channel stopper layer (30).

5 Claims, 28 Drawing Sheets

F I G . 4
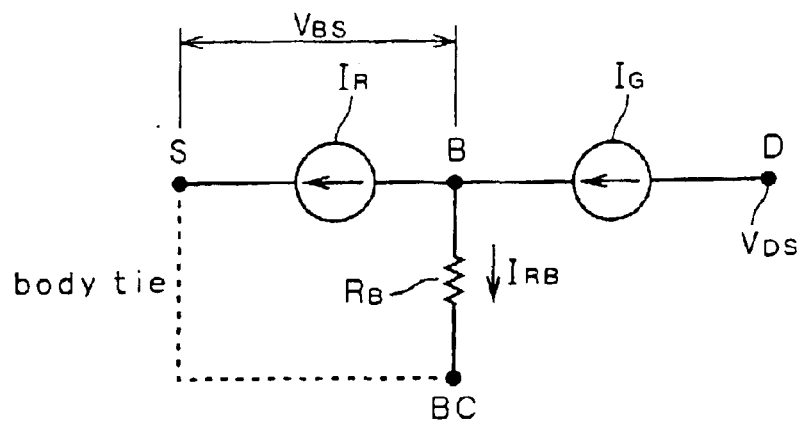
F I G . 5
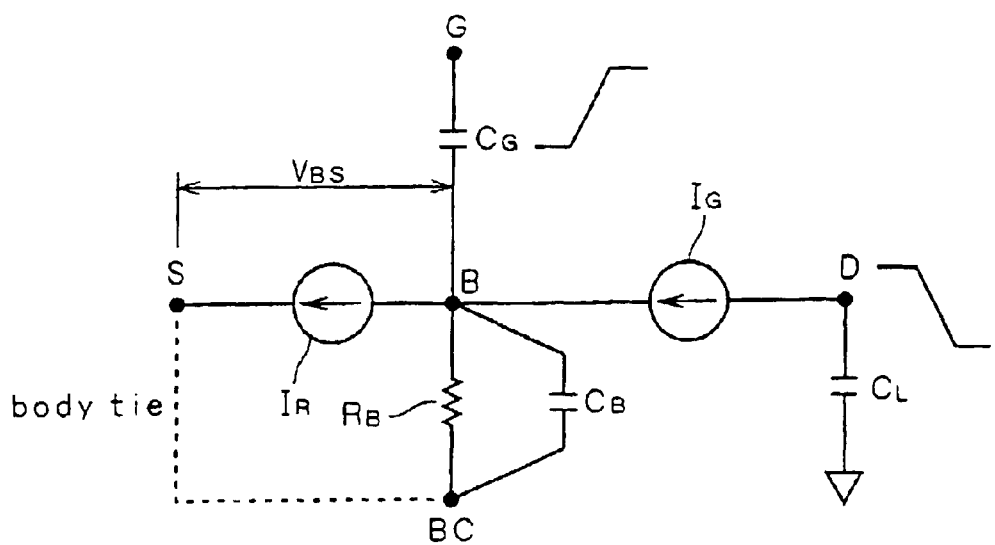

<PRIOR ART>

<PRIOR ART>

<PRIOR ART>

<PRIOR ART>

SEMICONDUCTOR DEVICE

BACKGROUND OF THE INVENTION

1. Field of the Invention

The present invention relates to a semiconductor device structure and a method of manufacturing the same. In particular, the invention relates to a semiconductor device structure incorporating a plurality of element isolation insulating films having different depths, as well as a method of manufacturing the same.

2. Description of the Background Art

An SOI (Silicon On Insulator) substrate is of a stacked structure in which a silicon substrate (hereinafter also called "semiconductor substrate"), a buried oxide film (hereinafter also called "BOX layer" or "insulating layer"), and a silicon layer (hereinafter also called "semiconductor layer") are stacked in the order named. Heretofore, the main semiconductor device using an SOI substrate was of the type in which semiconductor elements are surrounded by a full shallow trench isolation (FTI) extending from the upper surface of a semiconductor layer to the upper surface of an insulating layer. The semiconductor device of this type has, as compared to that using a bulk substrate not an SOI substrate, the following advantages: (i) no latch up occurs even with the formation of CMOS transistors; (ii) junction capacitance can be lowered to realize high speed operation; and (iii) the leakage current during standby condition is lessened to reduce power consumption.

However, the semiconductor device of this type has had various problems due to the semiconductor layer being in an electrically floating state, as follows. Firstly, kink effect may occur in $I_{DS}$-$V_{DS}$ characteristics, or an operational breakdown voltage may be lowered, because the carrier generated by impact ionization is stored in a lower part of a channel formation region. Secondly, the frequency dependence of a drain conductance ($g_o$) may occur because of an unstable potential of the channel formation region. Thirdly, the dependency to switching history may occur in the gate delay time because of an unstable potential of the channel formation region.

To overcome these problems, Japanese Patent Application Laid-Open No. 58-124243 (1983) has proposed a semiconductor device of the type in which a body contact region is selectively formed in an upper surface of a semiconductor layer, and semiconductor elements are surrounded by a partial shallow trench isolation (PTI) extending from the upper surface of the semiconductor layer to such a depth as not to reach the upper surface of an insulating layer. In the semiconductor device of this type, the body contact region and a channel formation region are electrically connected with each other, through the semiconductor layer disposed between the bottom surface of the PTI and the upper surface of the insulating layer. Therefore, the potential of the channel formation region can be fixed by an external power supply connected to the body contact region.

Recently, in order to achieve the scale down of semiconductor devices, there has been proposed a semiconductor device of the type which collectively fixes the potentials of the channel formation regions of a plurality of transistors of the same conductivity type, without individually fixing the potential of a channel formation region per transistor (see Proceedings 1997 IEEE International SOI Conference, Oct. 1997, pp140, 141, 164, 165, 170 and 171). In the semiconductor device of this type, the respective channel formation regions of adjacent transistors are isolated from each other, by a PTI.

Conventional Technique I

One example of the last-mentioned type semiconductor device will be described hereinafter. FIG. 28 is a top plan view of a semiconductor device structure according to a conventional technique I, and FIGS. 29 and 30 are sectional views taken along line L101 and line L102, respectively, in the semiconductor device shown in FIG. 28. For the sake of convenience, interlayer insulating films 127 to 129 shown in FIGS. 29 and 30, are omitted in FIG. 28. Referring to FIGS. 28 to 30, the semiconductor device of the conventional technique I comprises a PTI 140 disposed in a PTI formation region 101; a source/drain region 103 having a high concentration impurity region 118 and low concentration impurity region 119; a channel formation region 104 (i.e., a P type channel formation region 104n and an N type channel formation region 104p); source/drain wirings 105a and 105b; a gate wiring 106 having a stacked structure in which a doped polysilicon layer 121 and metal layer 122 are stacked in the order named; metal wirings 107 and 111; contact holes 108, 110, 125a and 125b; a body contact region 109; an SOI substrate 114 having a silicon substrate 115, BOX layer 116 and silicon layer 117; a gate oxide film 120; an insulating film 123; a sidewall 124; interlayer insulating films 127 to 129; a P type channel stopper layer 125; and an N type channel stopper layer 126.

Referring to FIG. 29, the NMOS and PMOS disposed adjacent each other are isolated by a PTI 140a. In the portion of the silicon layer 117 which is sandwiched between the bottom surface of the PTI 140a and the upper surface of the BOX layer 116, the N type channel stopper layer 126 is disposed on the side on which a PMOS formation region is disposed, and the P type channel stopper layer 125 is disposed on the side on which an NMOS formation region is disposed.

Referring to FIG. 30, an N$^+$ type body contact region 109 and an N type channel formation region 104p are electrically connected together, through an N type channel stopper layer 126 disposed in the portion of the silicon layer 117 which is sandwiched between the bottom surface of the PTI 140 and the upper surface of a BOX layer 116. Therefore, the potential of the channel formation region 104p can be fixed to the potential of a metal wiring 111 which is electrically connected to the body contact region 109, via the contact hole 110 filled with a conductive plug.

Conventional Technique II-a

Other conventional semiconductor device structure using a bulk substrate will be described hereinafter. FIG. 31 is a top plan view of a semiconductor device structure according to a conventional technique II-a, and FIG. 32 is a sectional view taken along line L103 in the semiconductor device shown in FIG. 31. For the sake of simplicity, only the internal structure of a silicon substrate 160 is illustrated in FIG. 32. Referring to FIGS. 31 and 32, the semiconductor device of the conventional technique II-a comprises a silicon substrate 160; an STI (Shallow Trench Isolation) 163 disposed in an element isolation region 150; a channel stopper layer 162; a bottom N well 164 disposed only in a memory cell region of the silicon substrate 160; a P well 161 overlying the bottom N well 164 and extending across the entire surface of the silicon substrate 160; a source/drain region 165; a channel formation region 166; a plurality of memory cells 151 disposed in the memory cell region of the silicon substrate 160; a plurality of NMOSs which have a source/drain region 154 and a gate electrode 155 and are disposed in a peripheral circuit region of the silicon substrate 160 on which a sense amplifier, etc. are disposed; a plurality of bit lines 152; and a plurality of word lines 153. The bottom N well 164 is provided for improving the soft error tolerance of the memory cells 151.

Referring to FIG. 32, the memory cell region and peripheral circuit region of the silicon substrate 160 are isolated by an STI 163a which is formed in such a depth as to extend from the upper surface of the silicon substrate 160 to the upper surface of the channel stopper layer 162. An STI 163 having the same depth as the STI 163a is disposed in the memory cell region and peripheral circuit region of the silicon substrate 160, respectively.

Conventional Technique II-b

A modification of the semiconductor device according to the conventional technique II-a will be described hereafter. FIG. 33 is a top plan view of a semiconductor device structure according to a conventional technique II-b, and FIG. 34 is a sectional view taken along the line L104 in the semiconductor device shown in FIG. 33. For the sake of simplicity, only the internal structure of a silicon substrate 160 is illustrated in FIG. 34. Referring to FIGS. 33 and 34, the semiconductor device of the conventional technique II-b comprises a silicon substrate 160; an STI 163 disposed in an element isolation region 150; a channel stopper layer 162; bottom N wells 164 disposed in a memory cell region and peripheral circuit region of the silicon substrate 160; a P well 161a disposed on the bottom N well 164 in the memory cell region of the silicon substrate 160; an N well 161b formed in the peripheral circuit region of the silicon substrate 160 so as to be shallower than the N well 161a; a source/drain region 165; a channel formation region 166; a plurality of memory cells 151 disposed in the memory cell region of the silicon substrate 160; a plurality of NMOSs which have a source/drain region 154 and a gate electrode 155 and are disposed in the peripheral circuit region of the silicon substrate 160; a plurality of bit lines 152; and a plurality of word lines 153. By making the P well 161b of the peripheral circuit region shallower than the P well 161a of the memory cell region, the breakdown voltage between the wells can be increased and the leakage current between the wells can be lowered in the peripheral circuit region. Thereby, in the peripheral circuit region, the width of an element isolation insulating film (not shown) for effecting isolation between the adjacent wells can be reduced, thus leading to the chip area reduction.

Referring to FIG. 34, the memory cell region and peripheral circuit region of the silicon substrate 160 are, as shown in FIG. 32, isolated by an STI 163a which is formed in such a depth as to extend from the upper surface of the silicon substrate 160 to the upper surface of the channel stopper layer 162. Also, as shown in FIG. 32, an STI 163 having the same depth as the STI 163a is disposed in the memory cell region and peripheral circuit region of the silicon substrate 160, respectively.

These conventional semiconductor devices, however, have the following drawbacks.

Drawbacks of Conventional Technique I

Referring again to FIG. 29, two drawbacks of the conventional technique I will be described as follows. Firstly, consider the case of applying 0 V to a metal wiring 105bp and a power supply voltage $V_{DD}$ to a metal wiring 105an, in such a state that a substrate voltage $V_{BB}$ is applied to the channel stopper layer 125 and to the channel formation region 104n, and a power supply voltage $V_{DD}$ is applied to the channel stopper layer 126 and to the channel formation region 104p. Due to the potential difference between the metal wiring 105bp and metal wiring 105an, a leakage current flows, via the channel stopper layers 125 and 126 underlying the PTI 140a, between the source/drain region 103 of the PMOS and the source/drain region 103 of the NMOS which are oppositely disposed and sandwich therebetween the PTI 140a. In general, PTIs have a lower element isolation breakdown voltage than FTIs. Therefore, in order to prevent such an occurrence, it is necessary to increase the width W101 of the PTI 140a between the PMOS and NMOS. This constitutes an obstruction to the scale down of semiconductor devices.

Secondly, referring again to FIG. 29, in the NMOS formation region, the P type channel stopper layer 125 underlying the PTI 140 forms a PN junction with the N type source/drain region 103. In the PMOS formation region, the N type channel stopper layer 126 underlying the PTI 140 forms a PN junction with the P type source/drain region 103. By the presence of these PN junctions, the junction capacitance is increased so that the delay time of the transistor switching operation is increased and the circuit operation is retarded.

Drawbacks of Conventional Technique II-a

FIG. 35 is a schematic sectional view of an ion implantation for forming a bottom N well 164. FIG. 36 is a sectional view showing in enlarged dimension the region X in FIG. 35. Referring to FIG. 35, with the vicinity of the center of an STI 163a as an alignment position, a photoresist 171 having a thickness of about 3 to 6 μm is formed on a peripheral circuit region of a silicon substrate 160, by means of a photolithographic process. By using the photoresist 171 as mask, phosphorus ions 170 is implanted into the silicon substrate 160 to form a bottom N well 164.

At this time, it is desirable that the edge of the photoresist 171 be perpendicular to the substrate surface. In fact, however, a taper 172 inclined toward the plane of the substrate surface at an angle of about 80° to 87°, is formed on the side surface of the photoresist 171. As a result, the phosphorus ions 170 are implanted into the portion of the silicon substrate 160 which is nearer to the peripheral circuit region than the alignment position. Thereby, lifted portions 164a and 164b of the N well 164, which follow the contours of the outer surface of the taper 172, are formed in the silicon substrate 160 underlying the STI 163a. Although the lifted portions 164a and 164b are originally connected together, these are separated because the concentration of the P type impurity is higher than that of the N type impurity, in the vicinity of the middle of the P well 161. Thereby, the lifted portion 164b is formed as a layer isolated from the bottom N well 164.

Referring to FIG. 36, when an N type source/drain region 165 of a memory cell region and an N type source/drain region 154 of a peripheral circuit region are isolated from each other by an STI 163a, a large leakage current will flow between the source/drain regions 165 and 154, depending on the bias conditions, which can cause malfunction. That is, a leakage current is caused by the lifted portions 164a and 164b of the bottom N well 164. The leakage current flows through the following two paths: a path 175 extending from the source/drain region 154 via the lifted portion 164a to the bottom N well 164; and a path 176 extending from the source/drain region 154 via the lifted portion 164b to the source/drain region 165. The reason why a leakage current flows is that, via the lifted portions 164a and 164b, the depletion layers of the source/drain regions 165 and 154 are connected with the depletion layer of the bottom N well 164, respectively.

In order to avoid such a leakage current, it is therefore necessary to increase the width W104 of the STI 163a between the memory cell region and peripheral circuit region, thus constituting an obstruction to the scale down of semiconductor devices.

Drawbacks in Conventional Technique II-b

FIG. 37 is a schematic sectional view of an ion implantation for forming a P well 161a. FIG. 38 is a sectional view showing in enlarged dimension the region Y in FIG. 37. Referring to FIGS. 37 and 38, a bottom N well 164 is formed on the entire surface of a wafer across a memory cell region and a peripheral circuit region of a silicon substrate 160. With the vicinity of the center of an STI 163a as an alignment position, a photoresist 181 having a thickness of about 3 to 6 µm is formed on the peripheral circuit region of the silicon substrate 160 by means of a photolithographic process. By using the photoresist 181 as a mask, boron ions 180 are implanted into the silicon substrate 160 to form a P well 161a. At this time, a taper 182 is formed on the side surface of the photoresist 181, and a P well lifted portion 161c which follows the contours of the outer surface of the taper 182 is formed in the silicon substrate 160 underlying the STI 163a, as previously described.

The P well lifted portion 161c derived from the P well 161a of the memory cell region extends into a channel formation region 166 of an NMOS in the peripheral circuit region. Therefore, the minority carriers (electrons) created in the peripheral circuit region, which serve as a leakage current, pass through the P well lifted portion 161c and the P well 161a to the memory cell region, thereby breaking the data stored in the memory cell.

In order to avoid occurrence of such a leakage current, it is therefore necessary to increase width W105 of the STI 163a between the memory cell region and peripheral circuit region, thereby constituting an obstruction to the scale down of semiconductor devices.

The foregoing description was made on the assumption that the sense amplifier of the peripheral circuit region is formed by the NMOS. However, a similar problem can occur even if the sense amplifier is formed by a PMOS or CMOS. Also, a similar problem can occur when the memory cell at the end of the memory cell region, which is adjacent via the STI 163a to the peripheral circuit region, is a dummy cell.

SUMMARY OF THE INVENTION

According to a first aspect of the present invention, a semiconductor device comprises: an SOI substrate having a stacked structure in which a semiconductor substrate, insulating layer and semiconductor layer are stacked in the order named; a first MOS transistor having a first channel formation region of a first conductivity type selectively formed in a main surface of the semiconductor layer; a second MOS transistor adjacent to the first MOS transistor, having a second channel formation region of a second conductivity type different from the first conductivity type and being selectively formed in the main surface of the semiconductor layer; first and second body contact regions selectively formed in the main surface of the semiconductor layer; a first element isolation insulating film of a partial isolation type disposed between the first body contact region and the first channel formation region, having such a depth as to extend from the main surface of the semiconductor layer and not reaching an upper surface of the insulating layer; a second element isolation insulating film of the partial isolation type disposed between the second body contact region and the second channel formation region, having such a depth as to extend from the main surface of the semiconductor layer and not reaching the upper surface of the insulating layer; and a third element isolation insulating film of a full isolation type extending from the main surface of the semiconductor layer to the upper surface of the insulating layer, disposed in a region containing at least the space between the first and second MOS transistors.

According to a second aspect, the semiconductor device of the first aspect is characterized in that the first MOS transistor further has paired source/drain regions of the second conductivity type sandwiching therebetween the first channel formation region and being selectively formed in the main surface of the semiconductor layer; and that the third element isolation insulating film surrounds the first MOS transistor, except for at least one of two side surfaces of the first channel formation region making no contact with the source/drain regions.

According to a third aspect the semiconductor device of the second aspect is characterized in that the third element isolation film surrounds the first MOS transistor, except for the two side surfaces of the first channel formation region; and that the first element isolation insulating film is formed in the space between the first body contact region and the two side surfaces of the first channel formation region.

According to a fourth aspect, the semiconductor device of the second or third aspect is characterized in that the first MOS transistor further has a gate electrode disposed on the main surface of the semiconductor layer above the first channel formation region; that the semiconductor device further comprises a channel stopper layer of the first conductivity type disposed in the portion of the semiconductor layer which is sandwiched between a bottom surface of the first element isolation insulating film and the upper surface of the insulating layer; and that the channel stopper layer has such a high impurity concentration as to satisfy $\sqrt{(C_B \cdot R_B)} < t_{gate}$, wherein $C_B$ and $R_B$ are the capacitance and resistance between the first channel formation region and the first body contact region, respectively, and $t_{gate}$ is a signal transition time of a pulse signal applied to the gate electrode.

According to a fifth aspect, a semiconductor device comprises: an SOI substrate having a stacked structure in which a semiconductor substrate, insulating layer and semiconductor layer are stacked in the order named; a first element isolation insulating film of a partial isolation type selectively formed in a memory cell region of the SOI substrate at a first depth extending from a main surface of the semiconductor layer and not reaching an upper surface of the insulating layer; a second element isolation insulating film of the partial isolation type selectively formed in a peripheral circuit region of the SOI substrate isolated from the memory cell region by an element isolation region of the SOI substrate, at a second depth extending from the main surface of the semiconductor layer and not reaching the upper surface of the insulating layer; and a third element isolation insulating film formed deeper than the first and second depth from the main surface of the semiconductor layer in the element isolation region.

According to a sixth aspect, the semiconductor device of the fifth aspect is characterized in that the third element isolation insulating film is an element isolation insulating film of a full isolation type extending from the main surface of the semiconductor layer and reaching the upper surface of the insulating layer.

According to a seventh aspect, a semiconductor device comprises: a substrate having first and second regions isolated by an element isolation region, a first element isolation insulating film selectively formed at a first depth in a main surface of the substrate in the first region of the substrate; a second element isolation insulating film selectively formed at a second depth in the main surface of the substrate in the second region of the substrate; an impurity introducing region disposed within the substrate only in the first region of the first and second regions of the substrate by performing an ion implantation into the substrate; and a third element isolation insulating film formed in the element isolation region of the substrate so as to extend from the main surface of the substrate to a point deeper than at least the first or second depth.

According to an eighth aspect, the semiconductor device of the seventh aspect is characterized in that the impurity introducing region is a first well of a first conductivity type; that the semiconductor device further comprises in the substrate a second well of a second conductivity type different from the first conductivity type, disposed on the first well across the first and second regions; and that the third element isolation insulating film extending from the main surface of the substrate to a point deeper than at least an upper surface of the second well.

According to a ninth aspect, the semiconductor device of the eighth aspect is characterized in that the third element isolation insulating film extends from the main surface of the substrate and reaches a bottom surface of the second well.

According to a tenth aspect, the semiconductor device of the seventh aspect is characterized in that the impurity introducing region is a first well of a first conductivity type; that the semiconductor device further comprises a second well of a second conductivity type different from the first conductivity type, disposed beneath the first well across the first and second regions; and that the third element isolation insulating film extends from the main surface of the substrate and reaches a bottom surface of the first well.

According to an eleventh aspect, a method of manufacturing a semiconductor device comprises the steps of: (a) preparing a substrate; (b) forming a first recess of a first depth by digging a first portion of a main surface of the substrate; (c) forming a predetermined film on a bottom surface of the first recess; (d) forming a second recess of a second depth shallower than the first depth by digging a second portion of the main surface of the substrate while the first recess is used to protect the main surface of the substrate underlying the first recess, which step is performed after the step (c); (e) removing the predetermined film, which step is performed after the step (d); and (f) filling the first and second recesses with an insulating film, which step is performed after the step (e).

With the first aspect, the first and second MOS transistors which are adjacent each other and have different conductivity types are isolated by the third element isolation insulating film of the full isolation. Therefore, as compared with an element isolation insulating film of a partial isolation, the width of the element isolation insulating film can be made shorter, thereby permitting the scale down of semiconductor devices.

In addition, the potentials of the first and second channel formation regions can be fixed because an electrical connection between the first body contact region and first channel formation region, and that between the second body contact region and second channel formation region, are made through the portion of the semiconductor layer which is sandwiched between the bottom surface of the first or second element isolation insulating film of the partial isolation type and the upper surface of the insulating layer.

With the second aspect, the source/drain region is surrounded by the third element isolation insulating film of the full isolation type, except for at least one of the two side surfaces of the first channel formation region. Therefore, when the channel stopper layer of the first conductivity type underlies the first element isolation insulating film of the partial isolation type, the junction capacitance generated between the channel stopper layer and source/drain regions can be lowered, thus permitting a high speed operation of semiconductor devices.

In addition, a small contact area between the channel stopper layer and source/drain regions enables to set the impurity concentration of the channel stopper layer at a high concentration.

With the third aspect, a uniform potential distribution in the direction in which the first channel formation region extends can be obtained because the potential of the first channel formation region can be fixed from both side surfaces.

With the fourth aspect, by increasing the impurity concentration of the channel stopper layer, the value of $R_B$ can be lowered and the potential of the first channel formation region can be fixed stably.

With the fifth aspect, the element isolation breakdown voltage of the third element isolation insulating film is higher than that of the first or second element isolation insulating film. This allows for a reduction in the width of the third element isolation insulating film, thus permitting the scale down of semiconductor devices.

With the sixth aspect, the element isolation breakdown voltage of the third element isolation insulating film can be further increased. This allows for a further reduction in the width of the third element isolation insulating film, thus enhancing the scale down of semiconductor devices.

With the seventh aspect, even when the lifted portion of the impurity introducing region is formed in the second region of the substrate due to the taper shape of the photoresist used in ion implantation, at least part of the lifted portion can be absorbed by the third element isolation insulating film, by forming the third element isolation insulating film deeper than the first or second element isolation insulating film.

With the eighth aspect, the lifted portion formed in the vicinity of the upper surface of the second well can be absorbed by the third element isolation insulating film.

With the ninth aspect, the lifted portion formed in the vicinity of the bottom surface of the second well can be absorbed by the third element isolation insulating film.

In addition, since the second well is divided by the third element isolation insulating film, the potential of the second well in the first region and that in the second region can be set independently.

With the tenth aspect, all the minority carriers created in the first or second region can be captured by the second well. Thus, it is avoided that the minority carriers diffuse from the first or second region to the second or first region.

In addition, since the first well is divided by the third element isolation insulating film, the potential of the first well in the first region and that in the second region can be set independently.

With the eleventh aspect, a plurality of element isolation insulating films having different depths can be formed in the main surface of the substrate by filling the first and second recesses having different depths, with an insulating film.

It is therefore a major object of the present invention to provide a semiconductor device structure and a manufacturing method thereof with which the scale down of a semiconductor device, especially, a semiconductor device using an SOI substrate, can be realized by suppressing a leakage current and decreasing a junction capacitance with the potential of a channel formation region fixed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram of an equivalent circuit of a MOS transistor when a DC bias is applied;

FIG. 5 is a circuit diagram of an equivalent circuit of a MOS transistor when a transient voltage is applied;

DESCRIPTION OF THE PREFERRED EMBODIMENTS

First Preferred Embodiment

Figure 1:
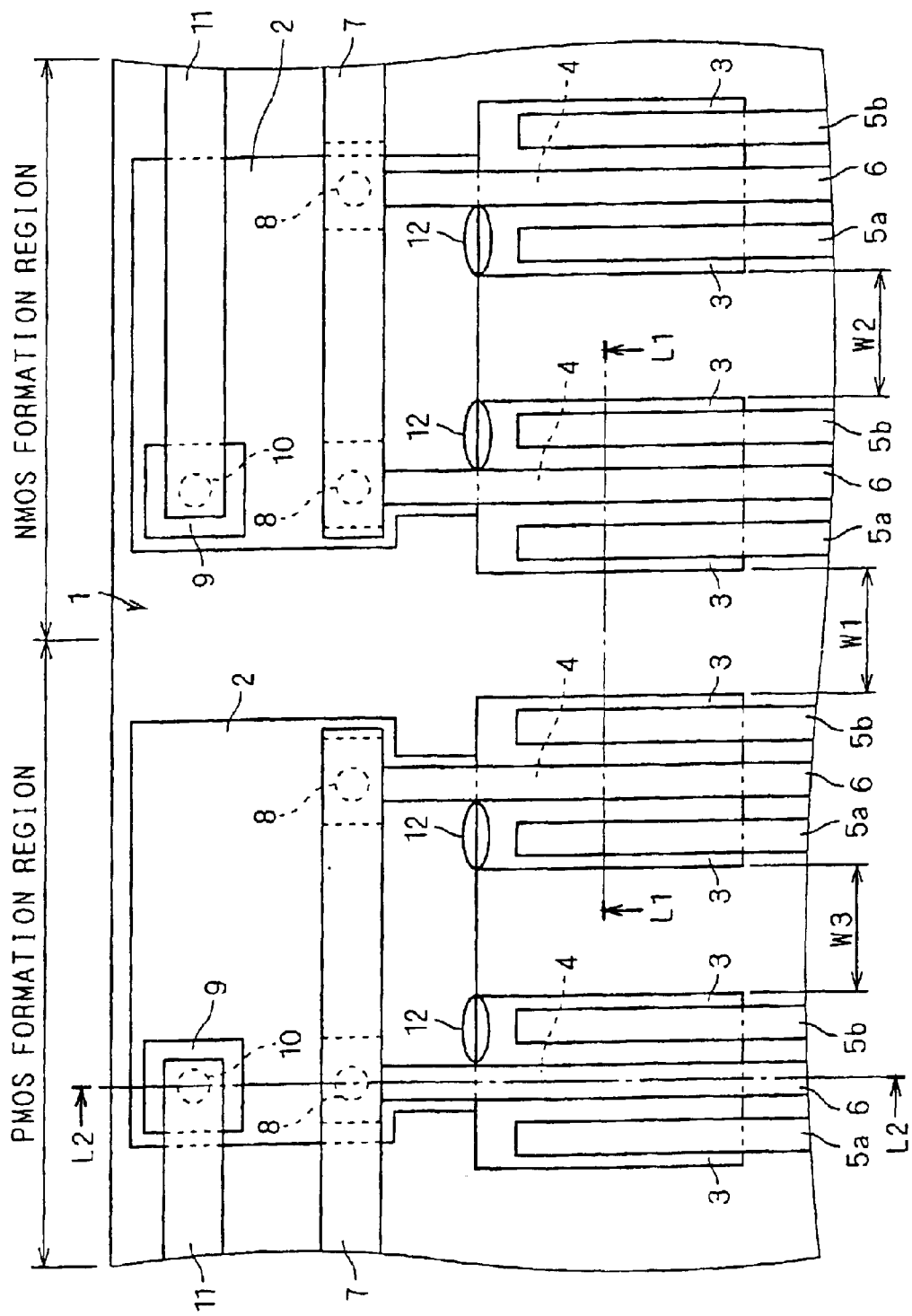
FIG. 1 is a top plan view of a semiconductor device structure according to a first preferred embodiment of the present invention.
Figure 2:
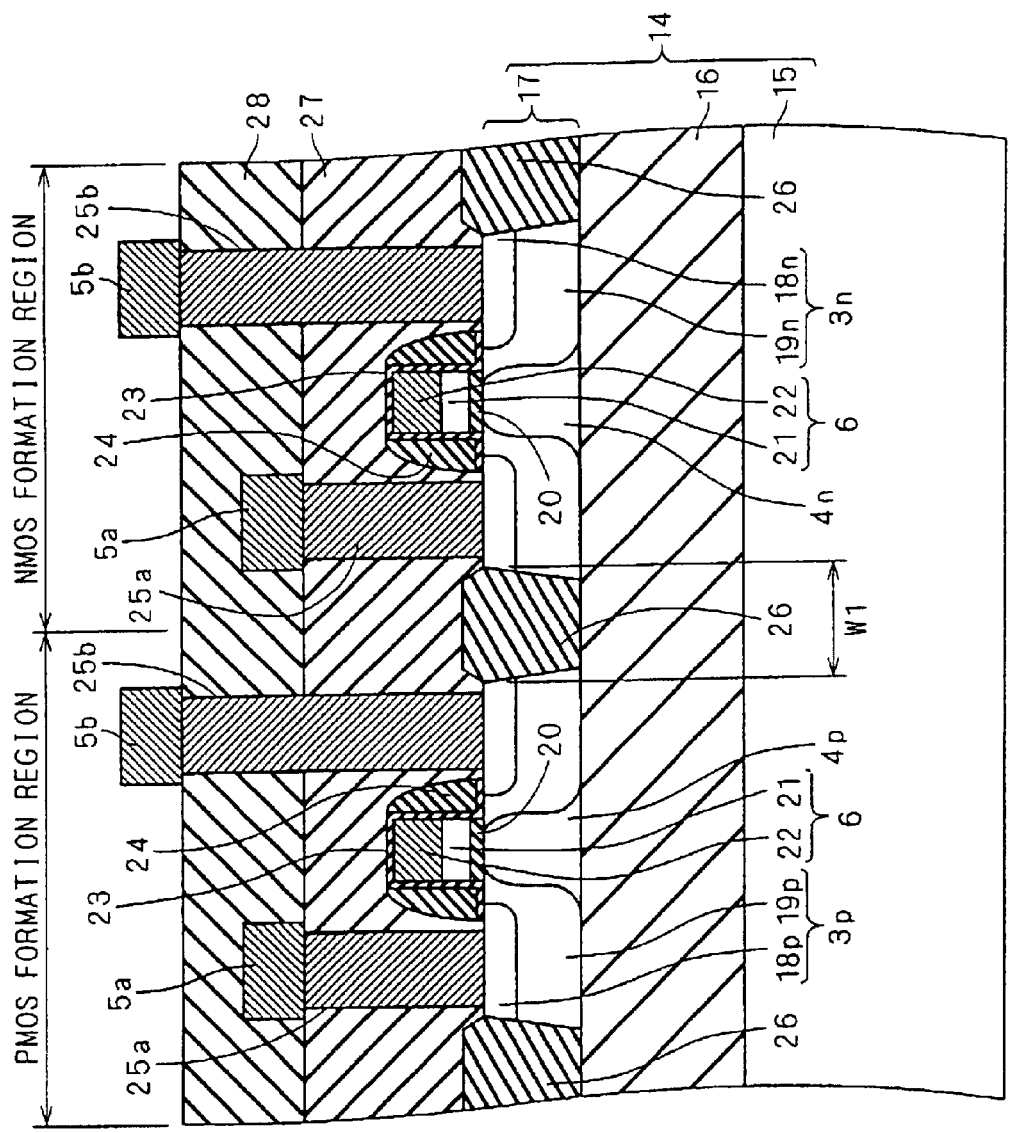
FIG. 2 is a sectional view taken along line L1—L1 in the semiconductor device of FIG. 1.
Figure 3:
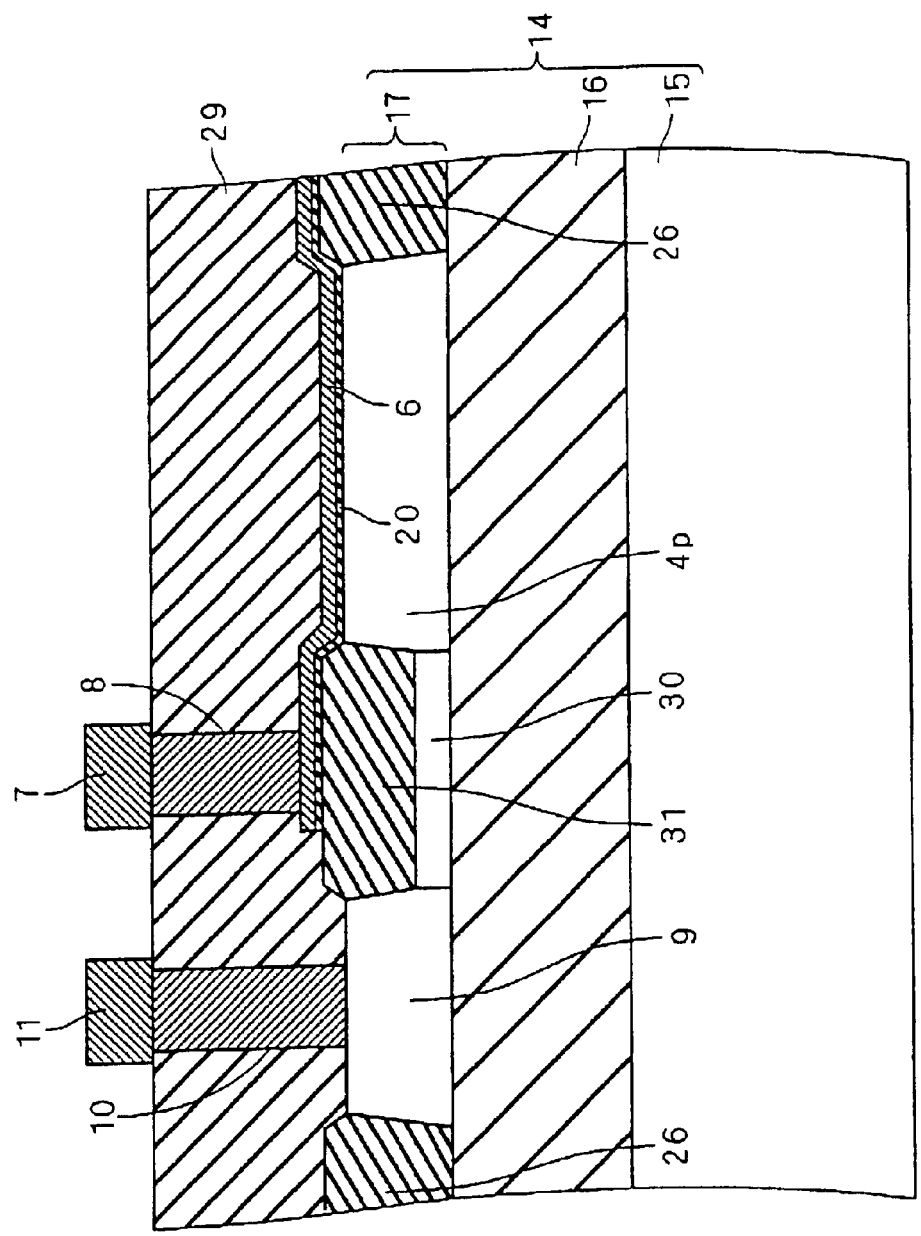
FIG. 3 is a sectional view taken along line L2—L2 in the semiconductor device of FIG. 1.

FIG. 1 is a top plan view of a semiconductor device structure according to a first preferred embodiment of the present invention. FIGS. 2 and 3 are sectional views taken along line L1—L1 and line L2—L2, respectively, in the semiconductor device of FIG. 1. For the sake of convenience, interlayer insulating films 27 to 29 and the like shown in FIGS. 2 and 3 are omitted in FIG. 1. Referring to FIG. 2, an SOI substrate 14 has a stacked structure in which a silicon substrate 15, BOX layer 16 and silicon layer 17 are stacked in the order named. By an FTI 26, the SOI substrate 14 is divided into a PMOS formation region and an NMOS formation region. The FTI 26 extends between the upper surface of the silicon layer 17 and the upper surface of the BOX layer 16. An NMOS is formed in the NMOS formation region of the SOI substrate 14. The NMOS has a P type channel formation region 4n selectively formed in an upper surface of the silicon layer 17; paired N type source/drain regions 3n which are selectively formed in an upper surface of the silicon layer 17 and sandwich therebetween the channel formation region 4n; and a gate structure formed at the portion of the silicon layer 17 at which the channel formation region 4n is present. The source/drain region 3n has a shallow high concentration impurity region 18n formed in an upper surface of the silicon layer 17, and a low concentration impurity region 19n extending from the upper surface of the silicon layer 17 to the upper surface of the BOX layer 16. The gate structure has a gate oxide film 20 overlying the upper surface of the silicon layer 17, and a gate electrode 6 overlying the gate oxide film 20. The gate electrode 6 has a stacked structure in which a doped polysilicon layer 21 and a metal layer 22 are stacked in the order named. The side surface and upper surface of the gate structure are covered with an insulating film 23, and a sidewall 24 is provided on the insulating film 23 on the side surface of the gate structure.

On the other hand, a PMOS is formed in a PMOS formation region of the SOI substrate 14. The PMOS has an N type channel formation region 4p selectively formed in an upper surface of the silicon layer 17; paired P type source/drain regions 3p which are selectively formed in an upper surface of the silicon layer 17 and sandwich therebetween the channel formation region 4p; and a gate structure, insulating film 23 and sidewall 24 which are similar to that in the NMOS. The source/drain region 3p has a shallow high concentration impurity region 18p formed in an upper surface of the silicon layer 17, and a low concentration impurity region 19p extending from the upper surface of the silicon layer 17 to the upper surface of the BOX layer 16.

An interlayer insulating film 27 is formed across the entire surface of the NMOS, PMOS and FTI 26 A plurality of metal wirings 5a are selectively formed on the interlayer insulating film 27. The metal wirings 5a are respectively connected to one of the paired source/drain regions 3n and 3p, through contact holes 25a filled with a conductive plug. An interlayer insulating film 28 is formed on the entire surface of the interlayer insulating film 27. A plurality of metal wirings 5b are selectively formed on the interlayer insulating film 28. The metal wirings 5b are respectively connected to the other of the paired source/drain regions 3n and 3p, through contact holes 25b filled with a conductive plug.

Referring to FIG. 3, an $N^+$ type body contact region 9 is selectively formed in an upper surface of a silicon substrate 14. The body contact region 9 extends from the upper surface of a silicon layer 17 to the upper surface of a BOX layer 16. The body contact region 9 is isolated from a channel formation region 4p by a PTI 31. The PTI 31 is formed at a predetermined depth from the upper surface of the silicon layer 17, and the bottom surface of the PTI 31 is not in contact with the upper surface of the BOX layer 16. A gate oxide film 20 and a gate electrode 6 are formed on the PTI 31. An N⁺ type channel stopper layer 30 is disposed at the portion of the silicon layer 17 which is sandwiched between the bottom surface of the PTI 31 and the upper surface of the BOX layer 16. Thereby, the body contact region 9 and channel formation region 4p are electrically connected with each other, through the channel stopper layer 30.

An interlayer insulating film 29 is formed on the entire surface of the body contact region 9, PTI 31, FTI 26, and gate electrode 6. Metal wirings 7 and 11 are selectively formed on the interlayer insulating film 29. The metal wiring 7 is connected to the gate electrode 6 through a contact hole 8 filled with a conductive plug selectively formed in the interlayer insulating film 29. The metal wiring 11 is connected to the body contact region 9 through a contact hole 10 filled with a conductive plug selectively formed in the interlayer insulating film 29.

The FTI 26 shown in FIG. 2 is formed within the FTI formation region 1 shown in FIG. 1. The PTI 31 shown in FIG. 3 is formed within the PTI formation region 2 shown in FIG. 1. Although it is not depicted in FIG. 1, underneath the PTI formation region 2, the channel stopper layer 30 is formed across the entire surface. As shown in FIG. 1, a plurality of NMOSs are disposed in the NMOS formation region, and a plurality of PMOSs are disposed in the PMOS formation region. Adjacently disposed NMOSs and adjacently disposed PMOSs are respectively isolated among themselves, by the FTI 26 formed within the FTI formation region 1.

Thus, in the semiconductor device of the first preferred embodiment, the FTI 26 is adopted to isolate the PMOS and NMOS disposed adjacent each other. Thereby, the width W1 of the FTI 26 between the PMOS and NMOS can be shorter than the width W101 of the conventional PTI 140a, thus leading to the scale down of semiconductor devices.

Further, since the body contact region 9 and channel formation region 4 are electrically connected with each other, through the channel stopper layer 30, the potential of the channel formation 4 can be fixed to that of the metal wiring 11. Accordingly, a kink effect on $I_{DS}$-$V_{DS}$ characteristics is avoidable like the conventional semiconductor devices.

Furthermore, except for the region 12 shown in FIG. 1, the source/drain region 3 is surrounded by the FTI 26. Thereby, the junction capacitance generated between the channel stopper layer 30 underlying the PTI 31 and the source/drain region 3 can be lowered than the conventional semiconductor devices, thus permitting a high speed operation of semiconductor devices.

In addition, by virtue of a small contact area between the channel stopper layer 30 and the source/drain region 3, the impurity concentration of the channel stopper layer 30 can be made higher than that of the conventional semiconductor devices. This offers the following advantages.

FIG. 4 is a circuit diagram of an equivalent circuit of a MOS transistor when a DC bias is applied with the potential of a channel formation region 4 fixed. Assuming that the potential of a source electrode S and that of a body contact region BC are set to the same value, when an OFF-state voltage is applied to a gate electrode and the MOS transistor is in a standby condition, a reverse bias is applied to a PN junction between a drain electrode D and a channel formation region (body) B. Therefore, a generation current $I_G$ flows from the drain electrode D to the channel formation region B. Whereas a forward bias is applied to a PN junction between the channel formation region B and a source electrode S. Therefore, a recombination current $I_R$ flows from the channel formation region B to the source electrode S. Hereat, let $I_{RB}$ be the current that flows from the channel formation region B to the body contact region BC through the channel stopper layer 30 underlying the PTI 31, and let $R_B$ be the resistance of the channel stopper layer 30. In this state, if the entire generation current $I_G$ flows to the body contact region BC, the potential of the channel formation region B is fixed stably. To realize this, it is required that $V_{BS}$ being approximately equal to $I_G \cdot R_B$ be higher than the thermal potential 26 meV at room temperature of 27° C. That is, it is required to satisfy $R_B < 0.026/I_G$.

FIG. 5 is a circuit diagram of an equivalent circuit of a MOS transistor when a transient voltage is applied to a gate electrode G with the potential of a channel formation region 4 fixed. Consider now the case that a step-like pulse signal is inputted to the gate electrode G. Hereat, let $t_{gate}$ be the time which it takes the potential of the gate electrode G to transit from "L" to "H" state (signal transition time), and let $\tau_B = \sqrt{(C_B \cdot R_B)}$, wherein $C_B$ is the capacitance formed between the channel formation region B and body contact region BC, be the time required for driving the charge (body charge) stored in the channel formation region B, out of the region B. In order to stably fix the potential of the channel formation region B, it is required that $\tau_B = \sqrt{(C_B \cdot R_B)}$ be shorter than $t_{gate}$. That is, it is required to satisfy $\sqrt{(C_B \cdot R_B)} < t_{gate}$. The latter requirement is stricter than the former, $R_B < 0.026/I_G$, under which the potential is fixed stably when a DC bias is applied. In order to satisfy the latter requirement even if $t_{gate}$ is made shorter, it is necessary to lower $C_B$ and $R_B$. Although $C_B$ can be lowered by increasing the distance between the channel formation region B and body contact region BC, it is unfavorable to increase this distance so much, from the point of view of the scale down of semiconductor devices. With the semiconductor device of the first preferred embodiment, $R_B$ can be lowered by increasing the impurity concentration of the channel stopper layer 30, thus enabling to stably fix the potential of the channel formation region B.

Second Preferred Embodiment

Figure 6:
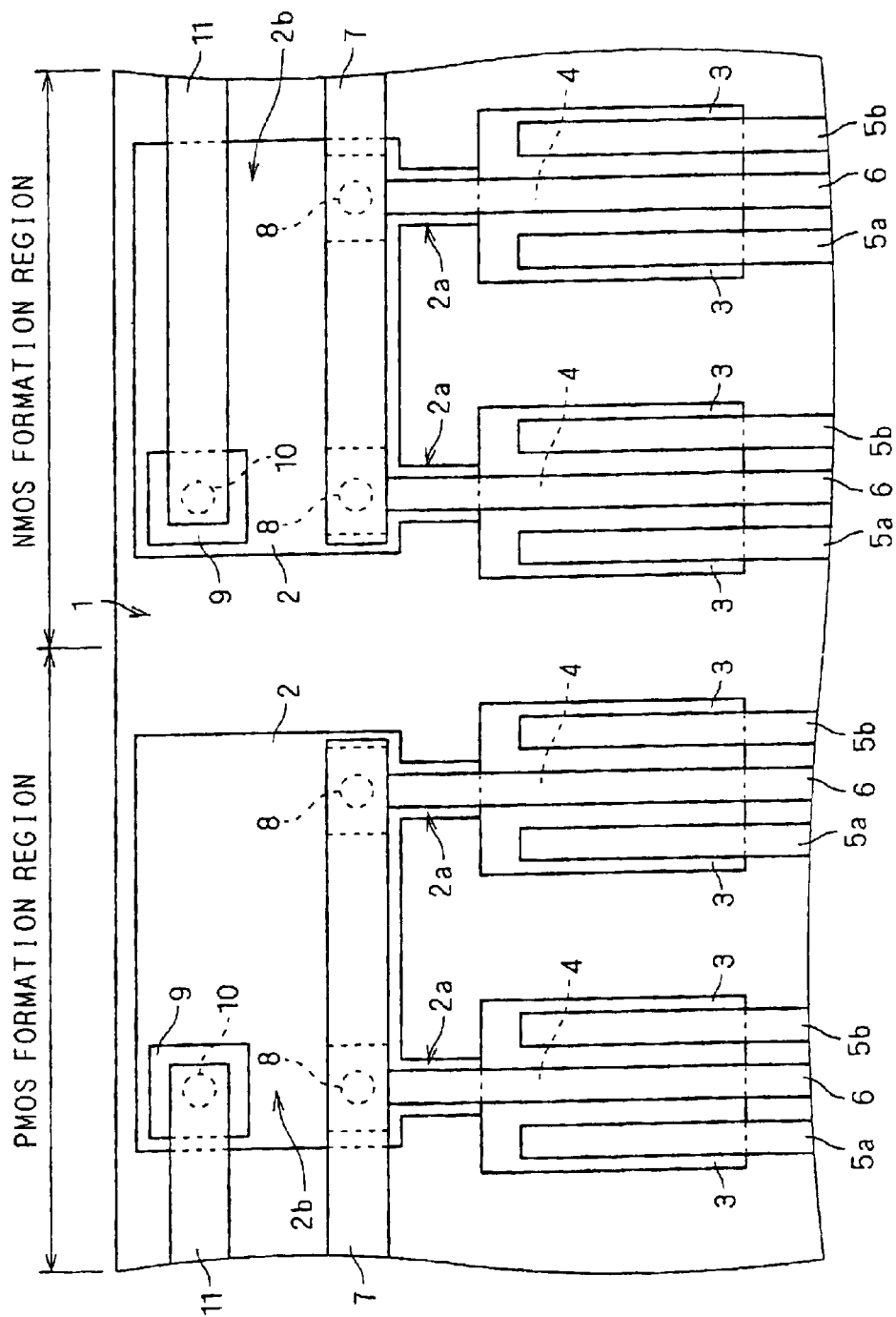
FIG. 6 is a top plan view of a semiconductor device structure according to a second preferred embodiment.

FIG. 6 is a top plan view of a semiconductor device structure according to a second preferred embodiment. In FIG. 6, for the sake of convenience, a PTI formation region 2, which is originally formed as an integral part, is illustrated by dividing it into a PTI formation region 2b underneath the region where metal wirings 7 and 11 are disposed, and a PTI formation region 2a extending between the PTI formation region 2b and an NMOS or PMOS. Although not illustrated in FIG. 6, a PTI 31 is disposed in the PTI formation regions 2a and 2b, and a channel stopper layer 30 is disposed beneath the PTI 31. The channel stopper layer 30 underlying the PTI 31 in the PTI formation region 2a is in contact with the side surface of a channel formation region 4. The term "side surface" of the channel formation region means a plane orthogonal in the direction in which the channel formation region extends (upward and downward as viewed in FIG. 6). The term "the side surface of the channel formation region" can be considered as a plane which makes no contact with the source/drain region, except for the upper and bottom surfaces.

Although not shown in FIG. 6, an FTI 26 is disposed in the FTI formation region 1. Looking at the surroundings of the NMOS and PMOS, it is noted that the FTI 26 surrounds the NMOS and PMOS, except for the side portion of the channel formation region 4 facing the PTI formation region 2b. Otherwise, the semiconductor device structure of the second preferred embodiment is identical to that of the first preferred embodiment with respect to FIGS. 1 to 3.

Thus, with the semiconductor device of the second preferred embodiment, it is also able to lower the junction capacitance generated in the region 12 shown in FIG. 1, thus permitting a higher operation speed of semiconductor devices.

Third Preferred Embodiment

Figure 7:
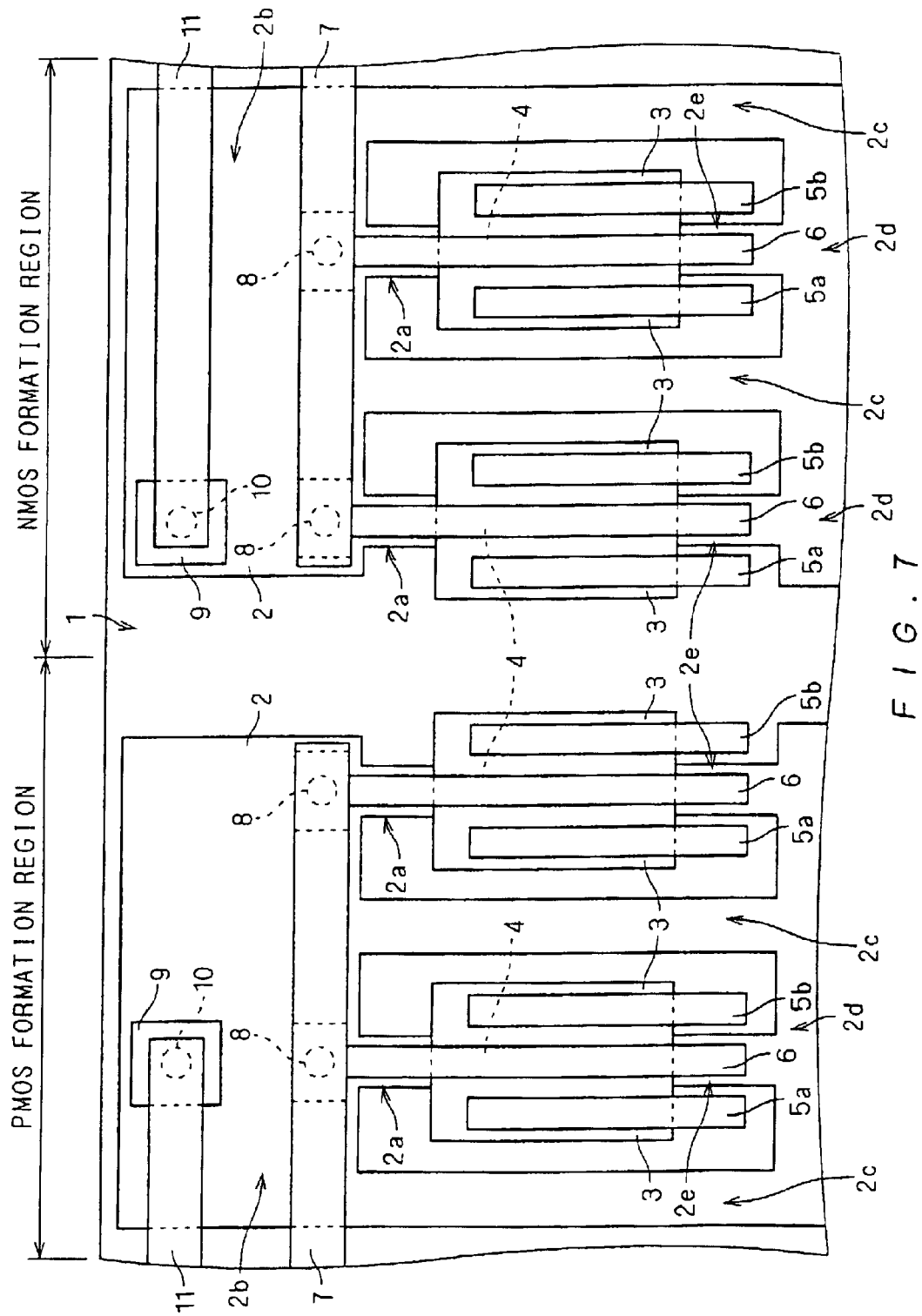
FIG. 7 is a top plan view of a semiconductor device structure according to a third preferred embodiment.

FIG. 7 is a top plan view of a semiconductor device structure according to a third preferred embodiment. In FIG. 7, for the sake of convenience, a PTI formation region 2, which is originally formed as an integral part, is illustrated by dividing it into PTI formation regions 2a to 2e. Although not illustrated in FIG. 7, a PTI 31 is disposed in the PTI formation regions 2a to 2e, and a channel stopper layer 30 is disposed beneath the PTI 31.

One side surface of a channel formation region 4 is in contact with the channel stopper layer 30 underlying the PTI 31 in the PTI formation region 2a. The other side surface of the channel formation region 4 is in contact with the channel stopper layer 30 underlying the PTI 31 in the PTI formation region 2e. That is, the semiconductor device of the third preferred embodiment is characterized in that both side surfaces of the channel formation region 4 make contact with the channel stopper layer 30. The PTI formation region 2e is connected via the PTI formation regions 2d and 2c to the PTI formation region 2b. Otherwise, the semiconductor device structure of the third preferred embodiment is identical to that of the first preferred embodiment with respect to FIGS. 1 to 3.

As in the semiconductor device of the first or second preferred embodiment, when the potential of the channel formation region 4 is fixed from one side surface only, a nonuniform potential distribution with respect to the gate width direction might be formed in the channel formation region 4 (especially, in the vicinity of the other side surface). Whereas in the third preferred embodiment, such a possibility is eliminated because the potential of the channel formation region 4 is fixed from both side surfaces thereof, thereby to ensure a uniform potential distribution with respect to the gate width direction.

Fourth Preferred Embodiment

Figure 8:
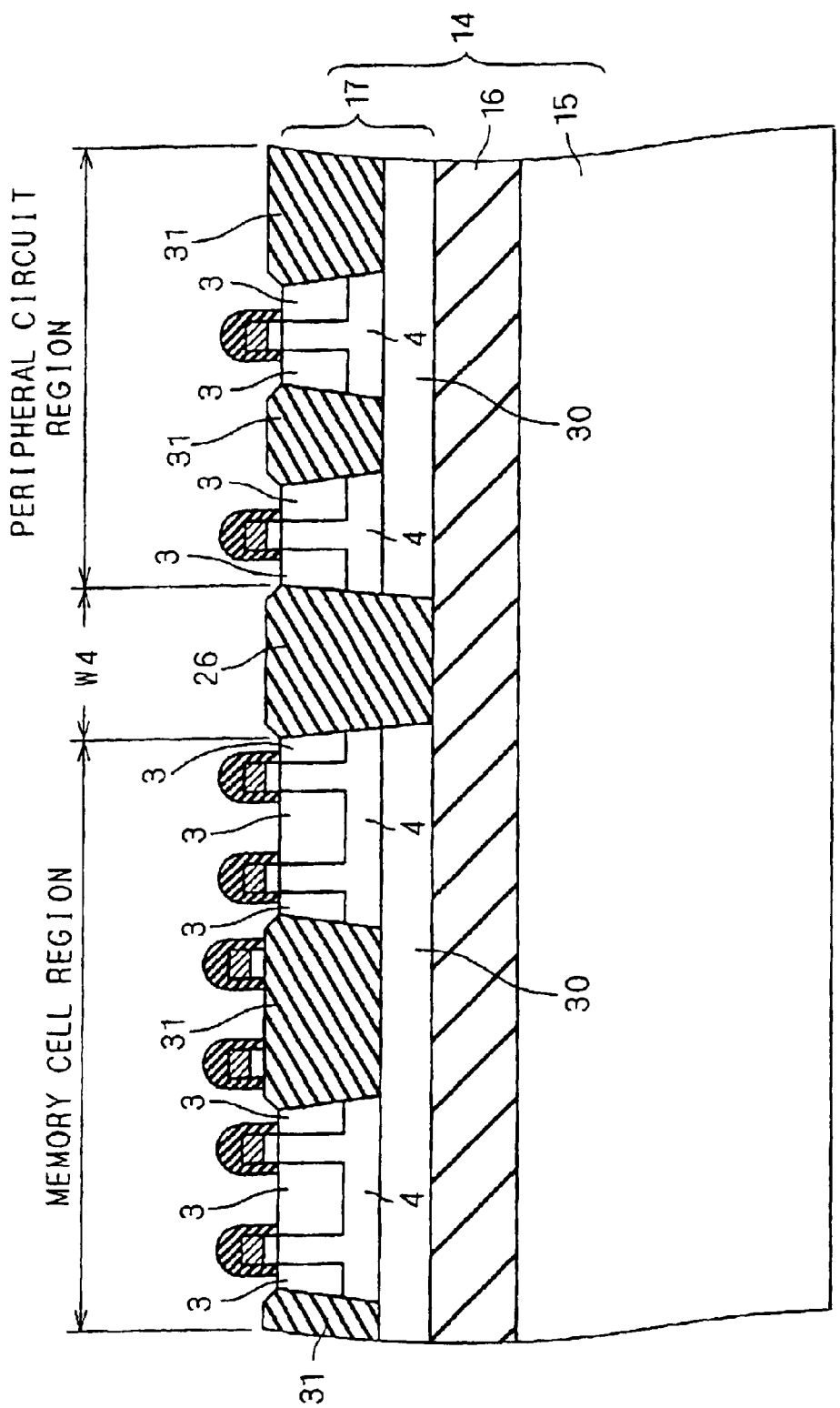
FIG. 8 is a sectional view of a semiconductor device structure according to a fourth preferred embodiment.

FIG. 8 is a sectional view of a semiconductor device structure according to a fourth preferred embodiment. A memory cell region and peripheral circuit region of an SOI substrate 14 are isolated from each other by an FTI 26 extending from the upper surface of a silicon layer 17 to the upper surface of a BOX layer 16. In the memory cell region and peripheral circuit region of the SOI substrate 14, a PTI 31 is selectively formed at such a depth as to extend from the upper surface of the silicon layer 17 to the upper surface of a channel stopper layer 30.

Figure 9:
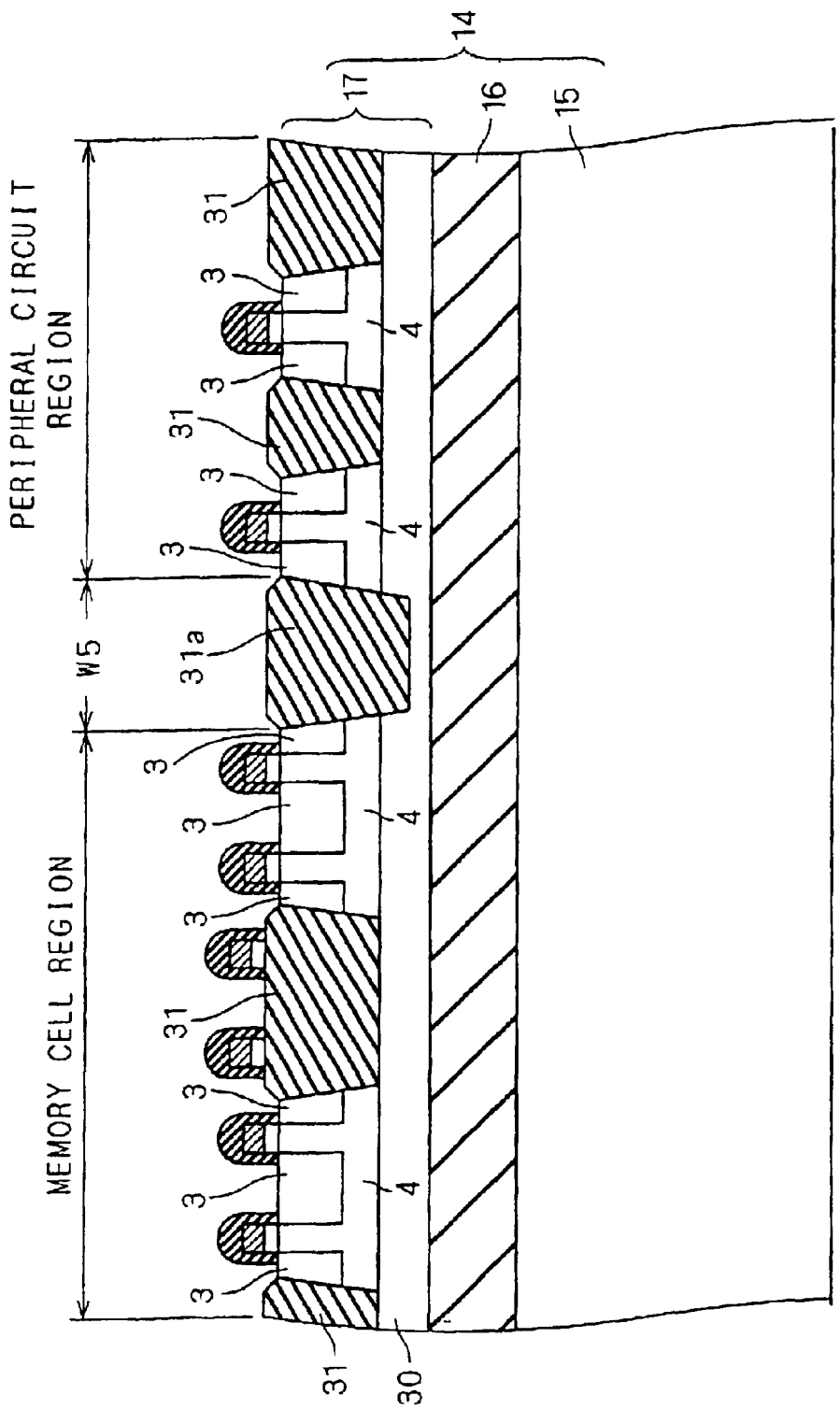
FIG. 9 is a top plan view of another semiconductor device structure according to the fourth preferred embodiment.

FIG. 9 is a sectional view of another semiconductor device structure according to the fourth preferred embodiment. In place of the FTI 26 shown in FIG. 8, a PTI 31a is formed which is deeper than the PTI 31 disposed in the memory cell region and peripheral circuit region.

Thus, with the semiconductor device of the fourth preferred embodiment, the memory cell region and peripheral circuit region of the SOI substrate 14 are isolated by the FTI 26 or PTI 31a, each having a higher element isolation breakdown voltage than the PTI 31. Therefore, as compared to the case of isolating both regions with a PTI having the same depth as the PTI 31, width W4 of the FTI 26 and width W5 of the PTI 31a can be made shorter, thus permitting the scale down of semiconductor devices.

In FIG. 8, the bottom surface of the FTI 26 matches the upper surface of the BOX layer 16. The same advantage as described above is obtainable even when the bottom surface of the FTI 26 is located below the upper surface of the BOX layer 16, by performing an over etching in the etching step for forming a trench for the FTI 26.

Fifth Preferred Embodiment

Figure 10:
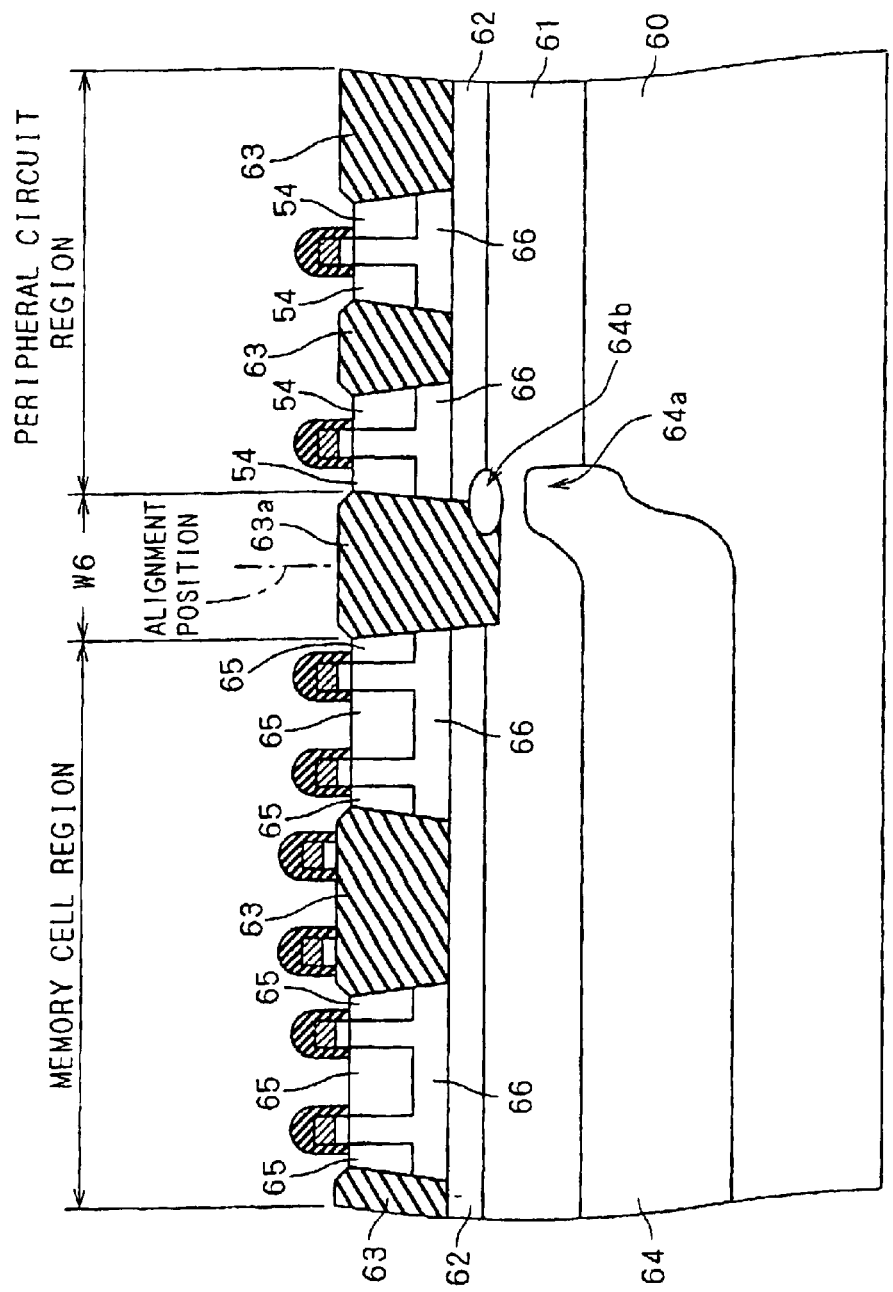
FIG. 10 is a sectional view of a semiconductor device structure according to a fifth preferred embodiment.
Figure 31:
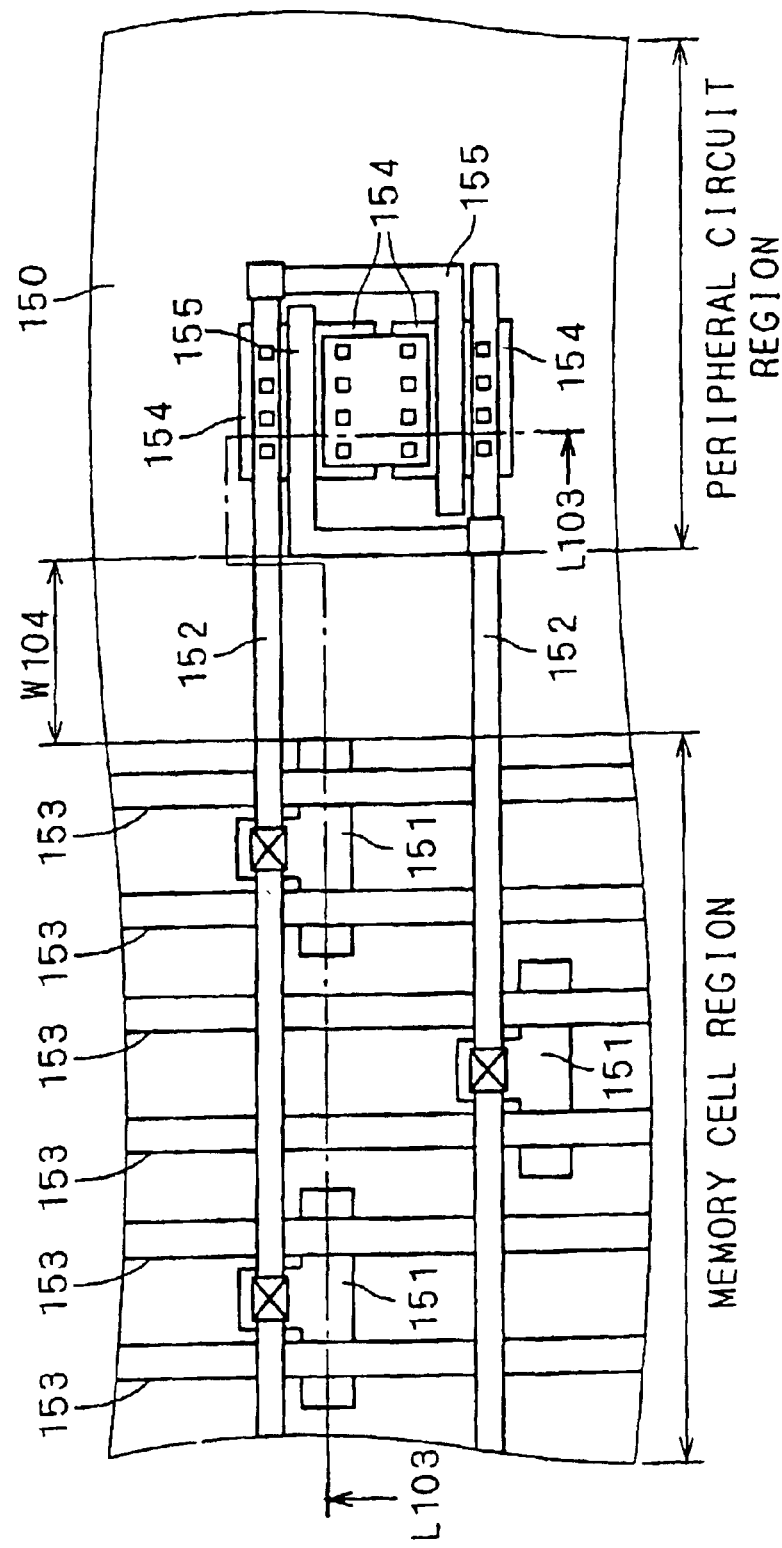
FIG. 31 is a top plan view of a semiconductor device structure according to a conventional technique II-a.
Figure 32:
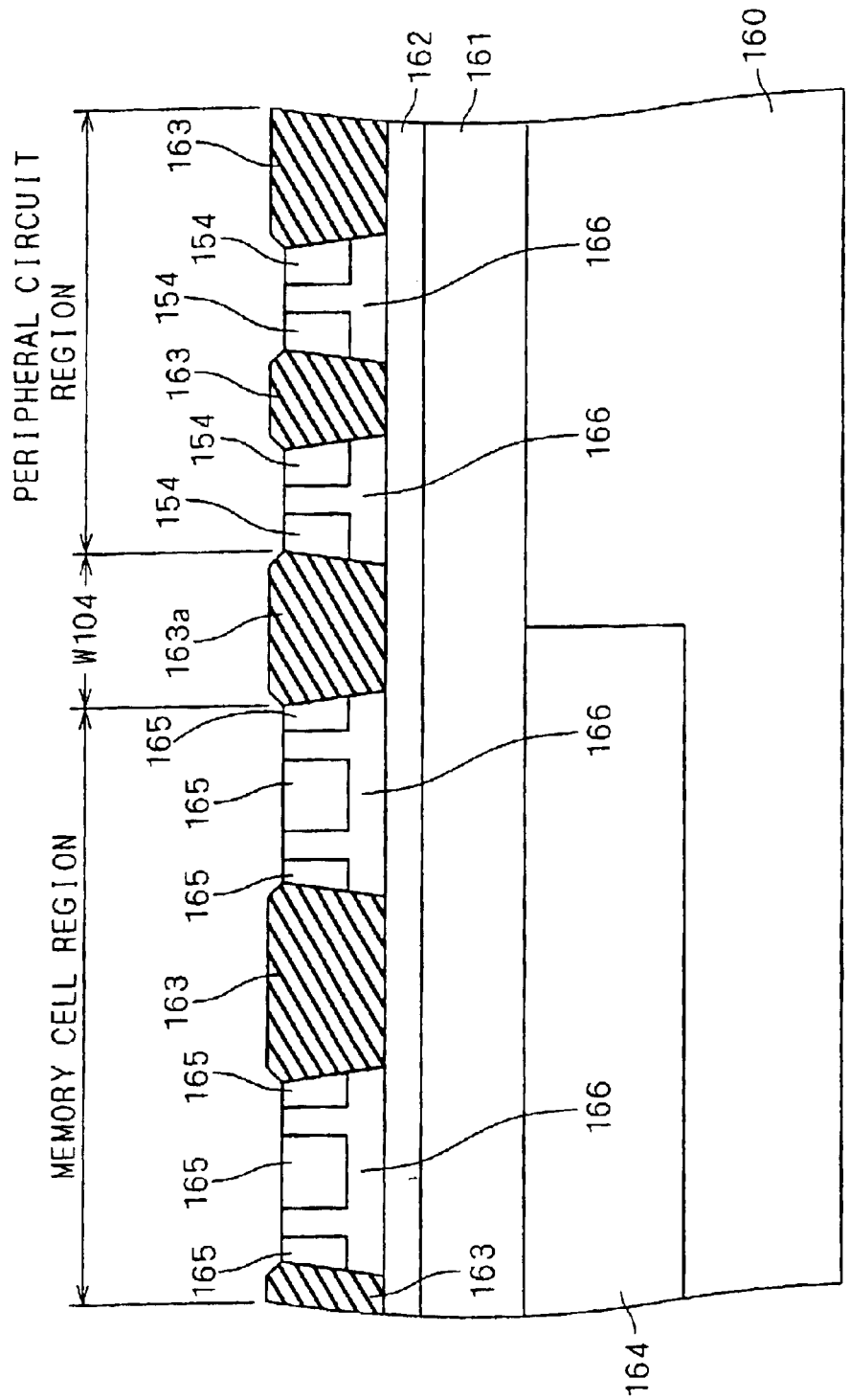
FIG. 32 is a sectional view taken along line L103—L103 in the semiconductor device in FIG. 31.

FIG. 10 is a sectional view of a semiconductor device structure according to a fifth preferred embodiment. Disposed in a silicon substrate 60 are a bottom N well 64 formed in a memory cell region only, a P well 61 overlying the bottom N well 64 across the memory cell region and a peripheral circuit region, and a channel stopper layer 62 overlying the P well 61 across the memory cell region and peripheral circuit region. An STI 63a for isolating the memory cell region and peripheral circuit region is selectively formed in an upper surface of the silicon substrate 60. The STI 63a extends from the upper surface of the silicon substrate 60 to a point deeper than the upper surface of the P well 61. As shown in FIG. 31 with respect to the conventional technique, a plurality of memory cells having an NMOS are disposed in the memory cell region, and an NMOS cross-connected sense amplifier, etc. are disposed in the peripheral circuit region.

Referring to FIG. 10, in an upper surface of the silicon substrate 60 in the memory cell region, paired N type source/drain regions 65 sandwiching therebetween a channel formation region 66, which are contained in the NMOSs constituting the abovementioned memory cells, and an STI 63 for isolating adjacent memory cells are formed. The STI 63 extends from the upper surface of the silicon substrate 60 to the upper surface of the channel stopper layer 62.

In an upper surface of the silicon substrate 60 in the peripheral circuit region, paired N type source/drain regions 54 sandwiching therebetween a channel formation region 66, which are contained in the NMOSs constituting the above-mentioned sense amplifier, and an STI 63 for isolating adjacent NMOSs are formed. The STI 63 extends from the upper surface of the silicon substrate 60 to the upper surface of the channel stopper layer 62.

As stated earlier in the conventional technique, a bottom N well 64 is formed in the following manner that after forming STIs 63 and 63a, with the vicinity of the center of the STI 63a as an alignment position, a photoresist is formed at a point nearer to the peripheral circuit region than the alignment position, and phosphorus ions is implanted into the silicon substrate 60 by using the photoresist as mask. At that time, due to a taper shape of the side surface of the photoresist, lifted portions 64a and 64b of the bottom N well 64 are formed in the silicon substrate 60. In the semiconductor device of the fifth preferred embodiment, the STI 63a is located deeper than a point at which the lifted portion 64b is present in the substrate 60.

Thus, with the semiconductor device of the fifth preferred embodiment, at least part of the lifted portion 64b can be absorbed by the STI 63a. This enables to suppress a leakage current between the source/drain region 65 of the memory cell region and the source/drain region 54 of the peripheral circuit region, which can occur due to the presence of the lifted portion 64b.

Figure 11:
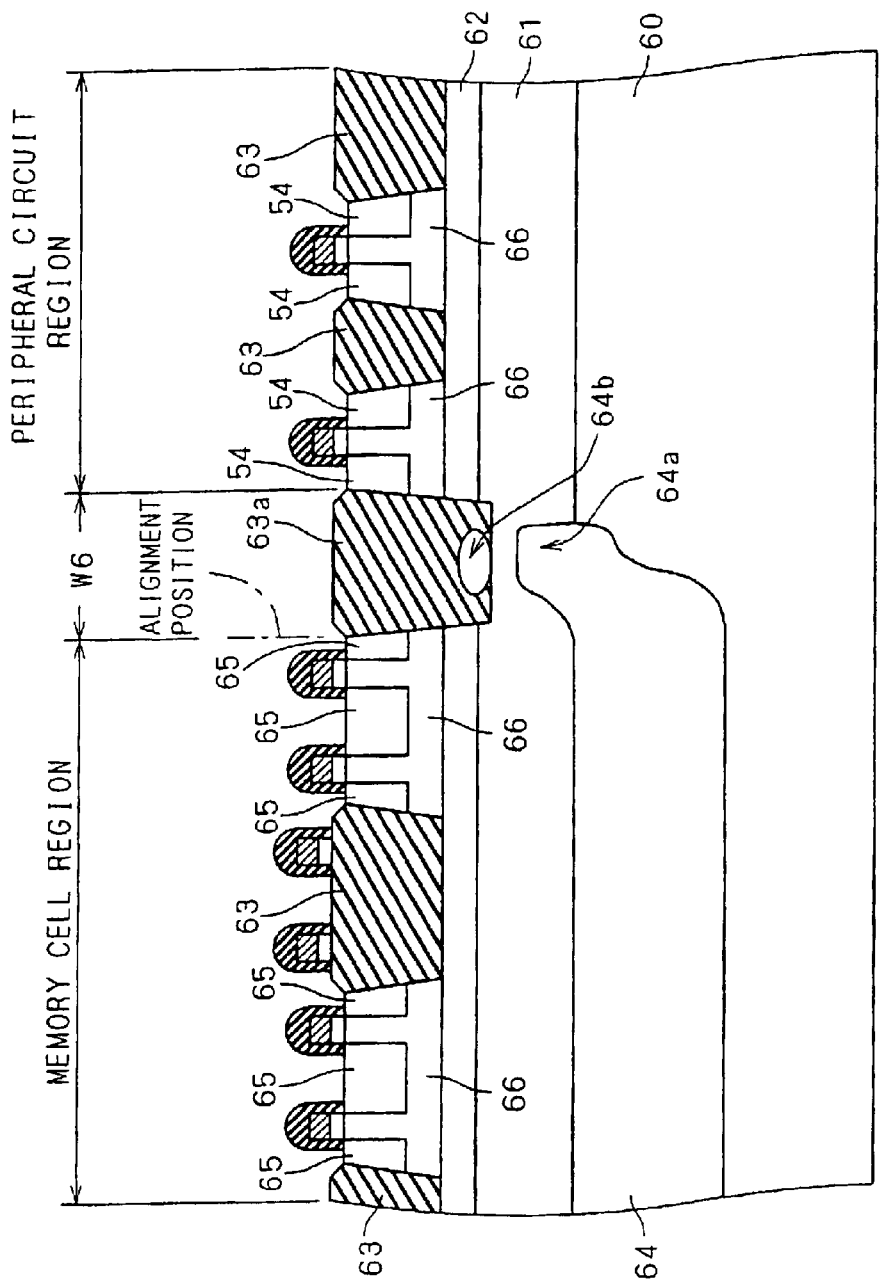
FIG. 11 is a sectional view of a first modification in the fifth preferred embodiment.

FIG. 11 is a sectional view of a semiconductor device structure according to a first modification of the fifth preferred embodiment. In the step of forming a photoresist used in forming a bottom N well 64, an alignment position is set to the vicinity of the boundary between a memory cell region and an STI 63a, instead of the vicinity of the center of the STI 63a. Thereby, lifted portions 64a and 64b are shifted to the side on which the memory cell region is disposed, and the lifted portion 64b is almost completely absorbed by the STI 63a.

Thus, with the first modification of the fifth preferred embodiment, the abovementioned leakage current due to the presence of the lifted portion 64b can be avoided because the lifted portion 64b can be almost completely absorbed by the STI 63a.

Figure 12:
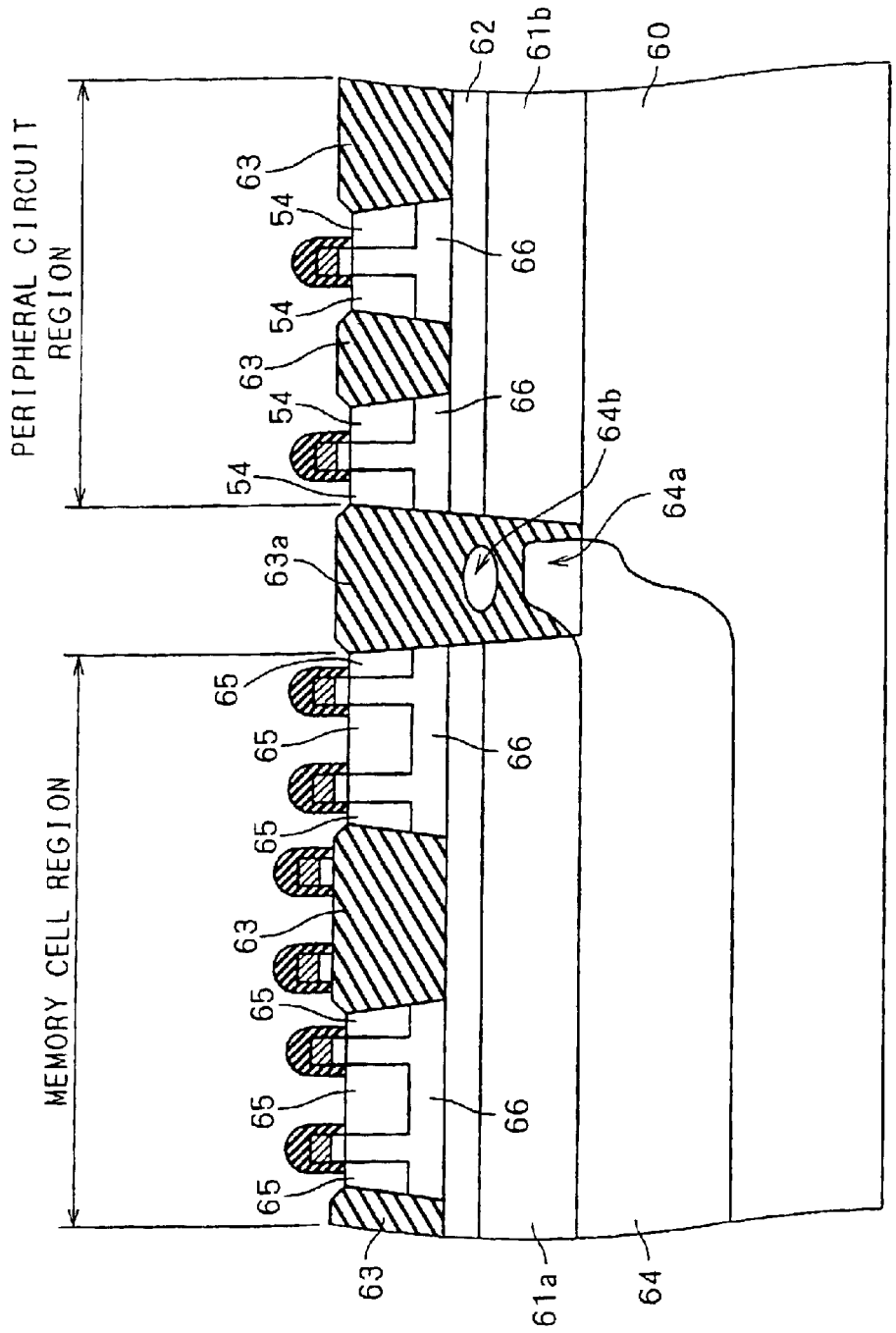
FIG. 12 is a sectional view of a second modification in the fifth preferred embodiment.

FIG. 12 is a sectional view of a semiconductor device structure according to a second modification of the fifth preferred embodiment. This modification is based on the semiconductor device shown in FIG. 10 or 11, and characterized in that an STI 63a is formed so deep as to extend from the upper surface of a silicon substrate 60 to the bottom surface of a P well 61a.

Thus, with the second modification of the fifth preferred embodiment, not only a lifted portion 64b but also at least part of a lifted portion 64a can be absorbed by the STI 63a. This enables to suppress or avoid a leakage current between a source/drain region 65 of a memory cell region and a source/drain region 54 of a peripheral circuit region, which can occur due to the presence of the lifted portion 64a. In addition, since a P well 61 is divided into the P well 61a of the memory cell region and a P well 61b of the peripheral circuit region, there is also the advantage that the potential of the P well 61a in the memory cell region and that of the P well 61b in the peripheral circuit region can be set independently.

Whereas in the semiconductor device shown in FIG. 10 or 11, since the P well 61 is formed across the memory cell region and peripheral circuit region, a substrate potential generating circuit for fixing the potential of the P well 61 may be disposed only in the peripheral circuit region. This offers the advantage of requiring no region for forming a substrate potential generating circuit in the memory cell region.

Sixth Preferred Embodiment

Figure 13:
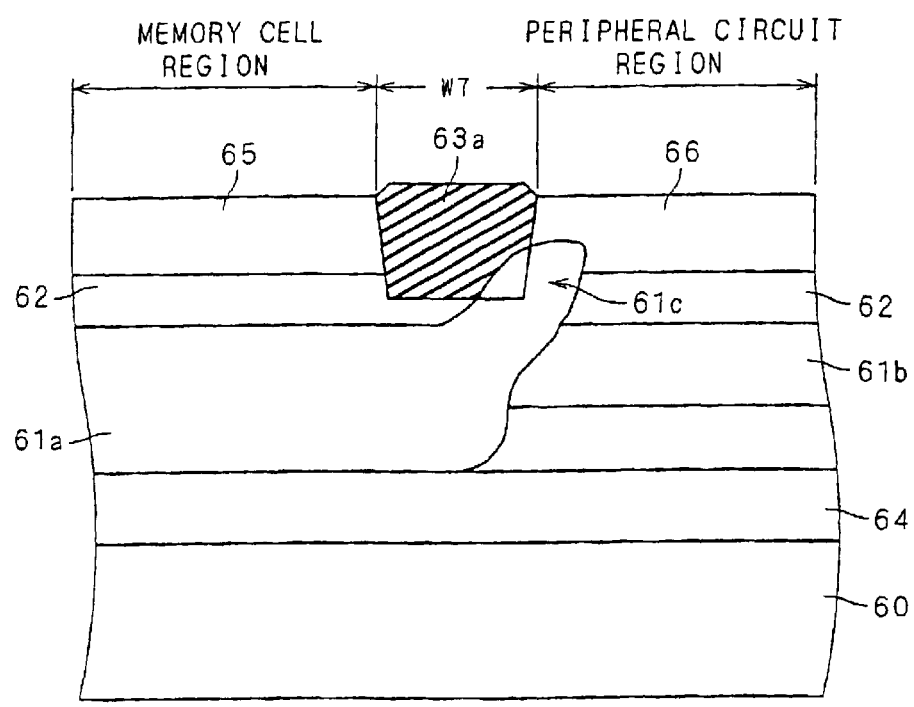
FIG. 13 is a sectional view of a semiconductor device structure according to a sixth preferred embodiment.
Figure 33:
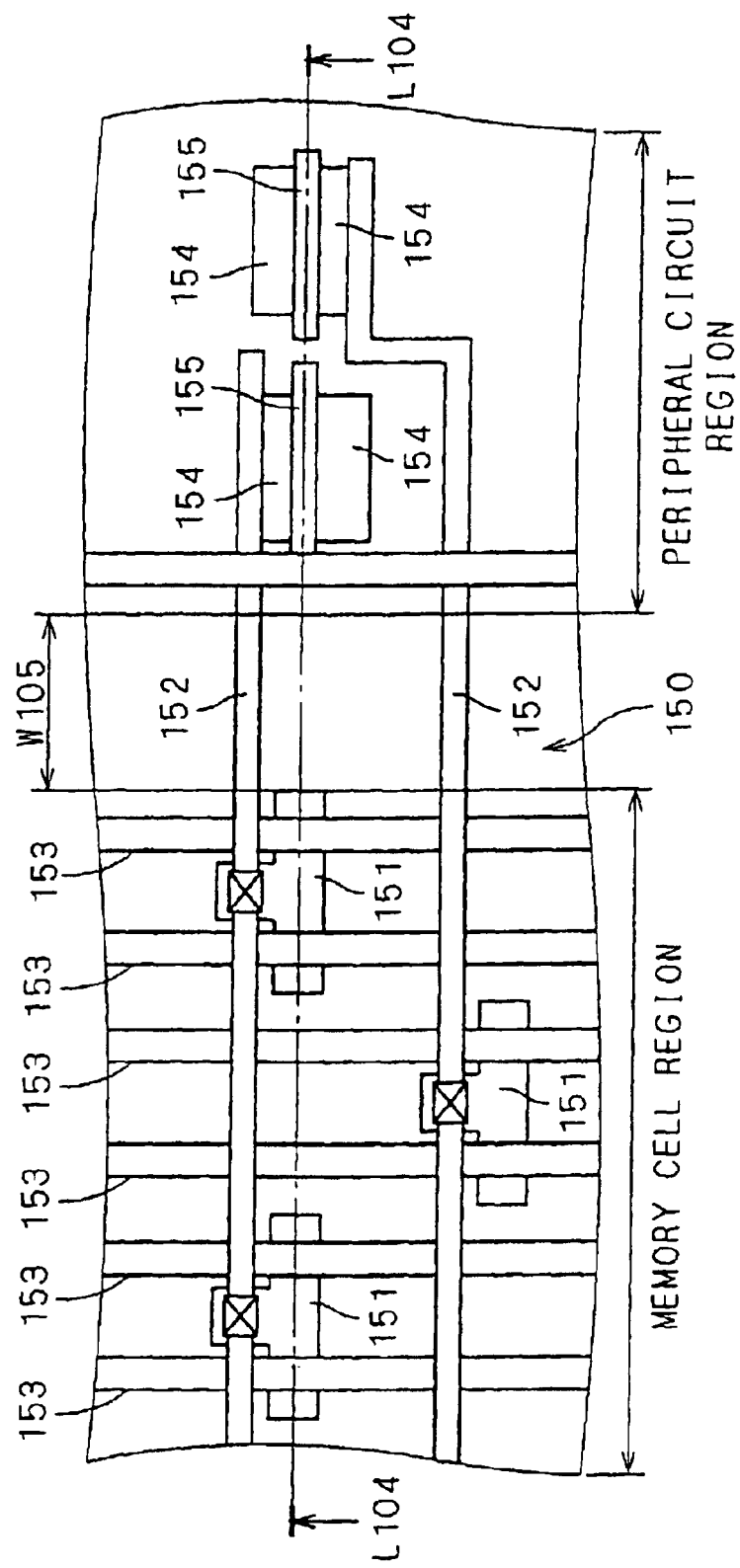
FIG. 33 is a top plan view of a semiconductor device structure according to a conventional technique II-b.
Figure 34:
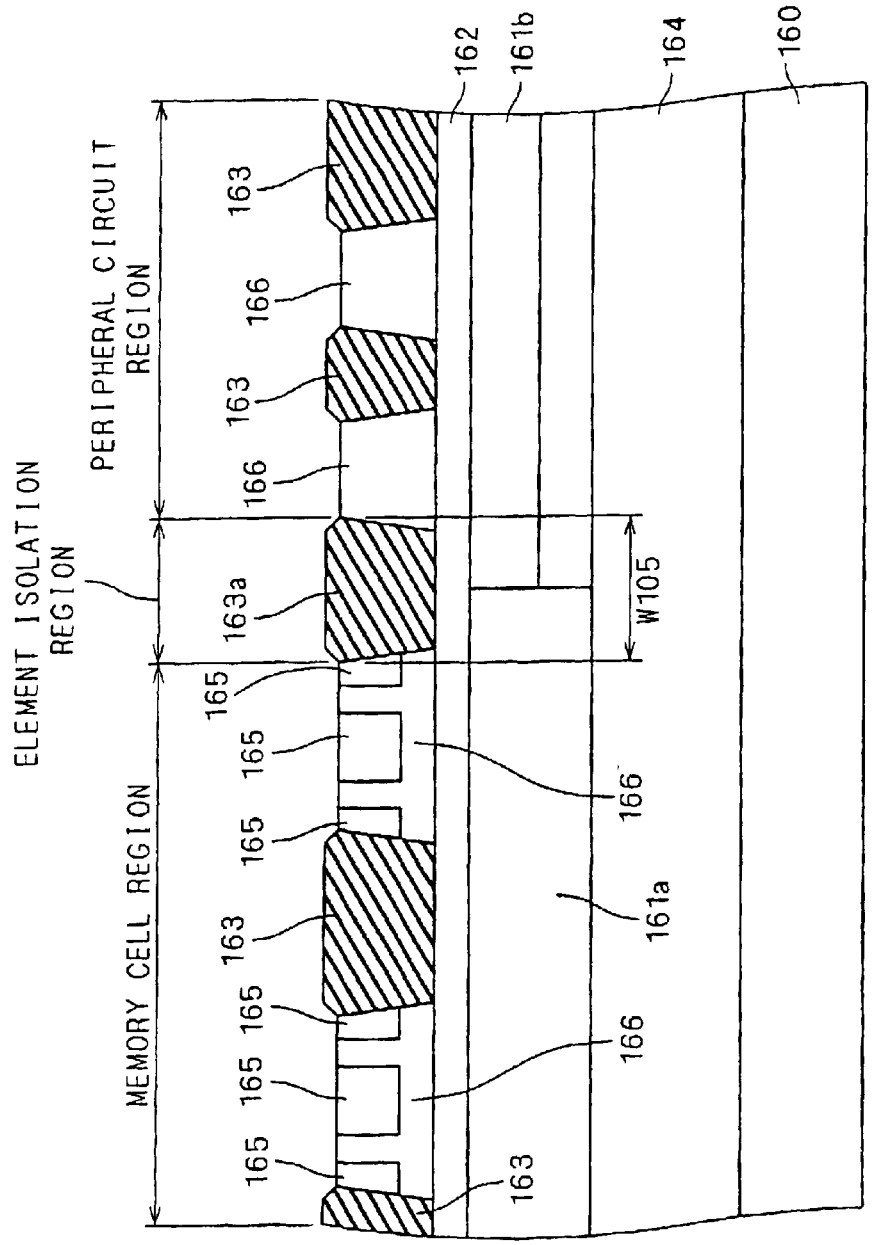
FIG. 34 is a sectional view taken along line L104—L104 in the semiconductor device of FIG. 33.
Figure 35:
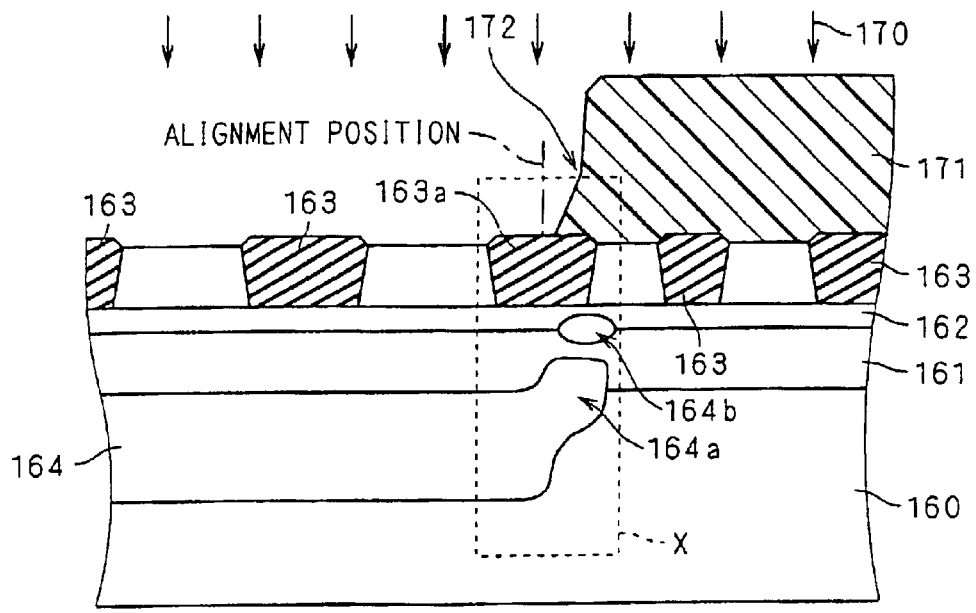
FIG. 35 is a sectional view schematically illustrating an ion implantation for forming an N well.
Figure 36:
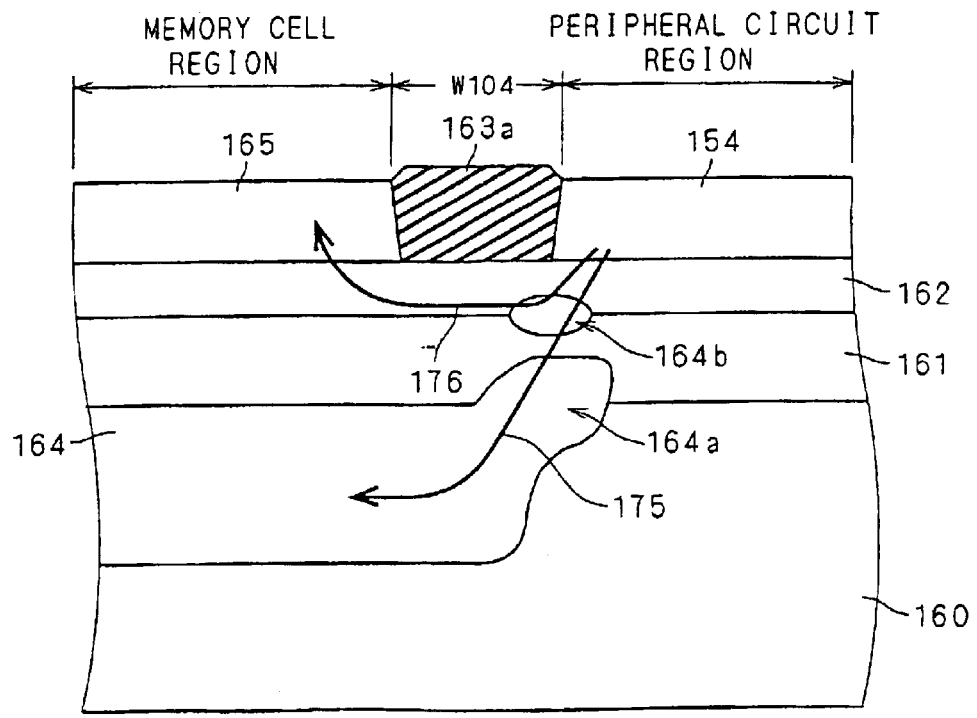
FIG. 36 is a sectional view showing in enlarged dimension the region X in FIG. 35.
Figure 37:
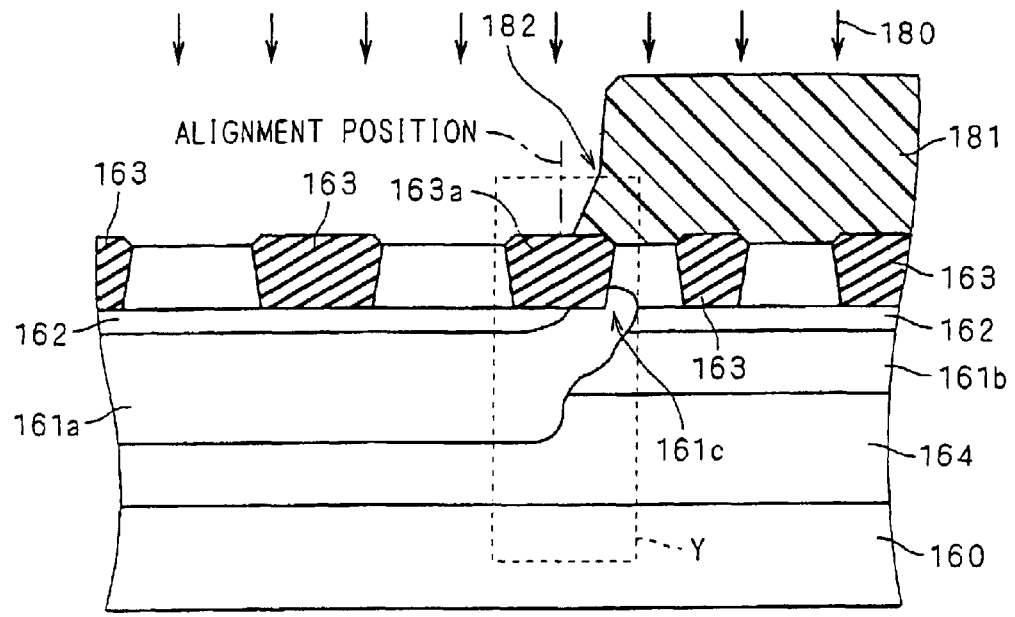
FIG. 37 is a sectional view schematically illustrating an ion implantation for forming a P well.
Figure 38:
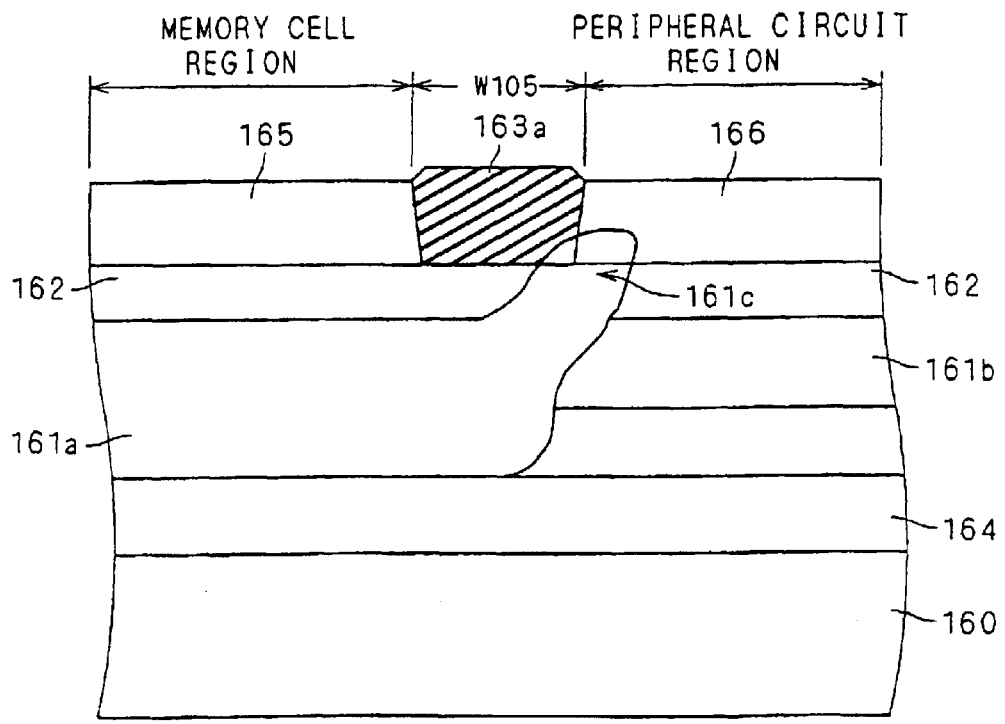
FIG. 38 is a sectional view showing in enlarged dimension the region Y in FIG. 37.

FIG. 13 is a sectional view of a semiconductor device structure according to a sixth preferred embodiment. Disposed in a silicon substrate 60 are a bottom N well 64 formed across a memory cell region and a peripheral circuit region, a P well 61a overlying the bottom well 64 in the memory cell region, a P well 61b formed in the peripheral circuit region so as to shallower than the P well 61a, and a channel stopper layer 62 overlying the P wells 61a and 61b and extending across the memory cell region and peripheral circuit region. An STI 63a for isolating the memory cell region and peripheral circuit region from each other is selectively formed in an upper surface of the silicon substrate 60. As shown in FIG. 33 with respect to the conventional technique, a plurality of memory cells are disposed in the memory cell region, and a sense amplifier, etc., having an NMOS, are disposed in the peripheral circuit region.

Referring to FIG. 13, in an upper surface of the silicon substrate 60 in the memory cell region, an N type source/drain region 65 extending from the upper surface of the silicon substrate 60 to the upper surface of the channel stopper layer 62 is disposed which is contained in the NMOS constituting the above-mentioned memory cells. As shown in FIG. 11, in an upper surface of the silicon substrate 60 in the memory cell region, an STI 63 for isolating adjacent memory cells is formed which extends from the upper surface of the silicon substrate 60 to the upper surface of the channel stopper layer 62.

In an upper surface of the silicon substrate 60 in the peripheral circuit region, a channel formation region 66 extending from the upper surface of the silicon substrate 60 to the upper surface of the channel stopper layer 62 is disposed which is contained in the NMOS constituting the above-mentioned sense amplifier. As shown in FIG. 11, in an upper surface of the silicon substrate 60 in the peripheral circuit region, an STI 63 is formed which extends from the upper surface of the silicon substrate 60 to the upper surface of the channel stopper layer 62.

As stated earlier in the conventional technique, a P well 61a is formed in the following manner that after forming STIs 63 and 63a, with the vicinity of the center of the STI 63a as an alignment position, a photoresist is formed at a point nearer to the peripheral circuit region than the alignment position, and boron ions or the like are implanted into the silicon substrate 60 by using the photoresist as mask. At that time, due to a taper shape on the side surface of the photoresist, a lifted portion 61c of the P well 61a is formed in the silicon substrate 60. In the semiconductor device of the sixth preferred embodiment, the STI 63a extends from the upper surface of the silicon substrate 60 to a point deeper than the upper surface of the channel stopper layer 62.

Thus, with the semiconductor device of the sixth preferred embodiment, at least part of the lifted portion 61c can be absorbed by the STI 63a. This enables to suppress minority carriers (electrons in this case) from dispersing from the peripheral circuit region to the memory cell region, which can occur due to the presence of the lifted portion 61c.

It is, of course, possible to suppress the minority carrier dispersion more effectively in the following manner, as in the first modification of the fifth preferred embodiment, that in the step of forming a photoresist for forming the P well 61a, an alignment position is set to the vicinity of the boundary between the memory cell region and the STI 63a, instead of the vicinity of the center of the STI 63a.

Figure 14:
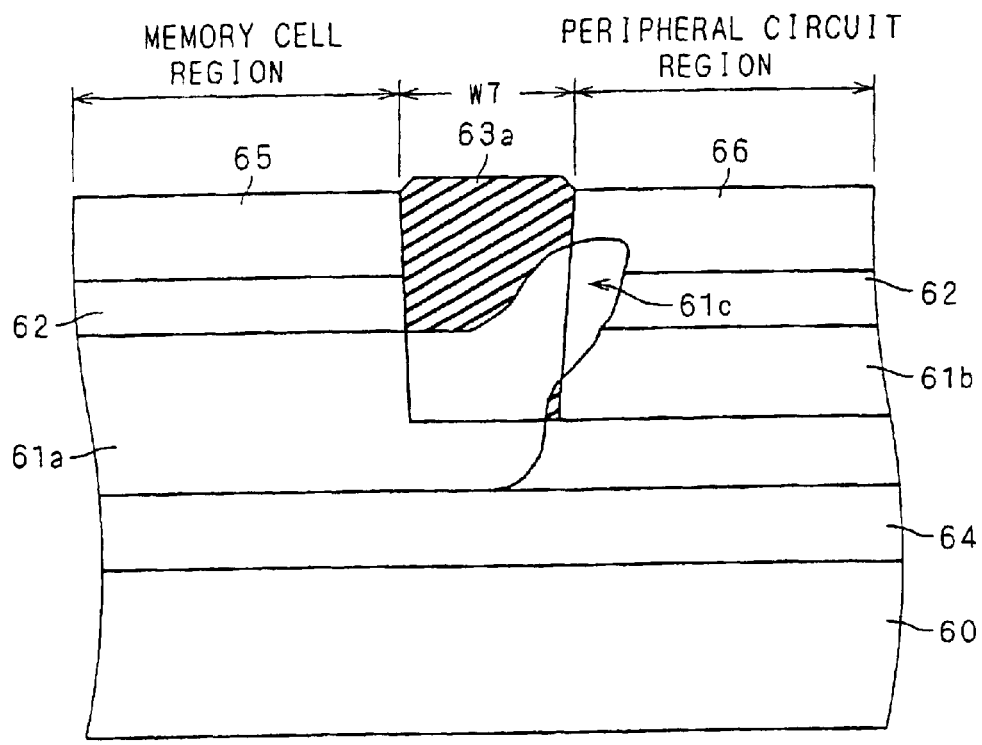
FIG. 14 is a sectional view of a first modification in the sixth preferred embodiment.

FIG. 14 is a sectional view of a semiconductor device structure according to a first modification of the sixth preferred embodiment. This modification is based on the semiconductor device shown in FIG. 13, and characterized in that an STI 63a is formed so deep as to extend from the upper surface of a silicon substrate 60 to the bottom surface of a P well 61b.

Thus, with the first modification of the sixth preferred embodiment, as compared to that shown in FIG. 13, most of a lifted portion 61c can be absorbed by the STI 63a. This enables to further suppress the above-mentioned minority carrier diffusion caused by the presence of the lifted portion 61c.

Figure 15:
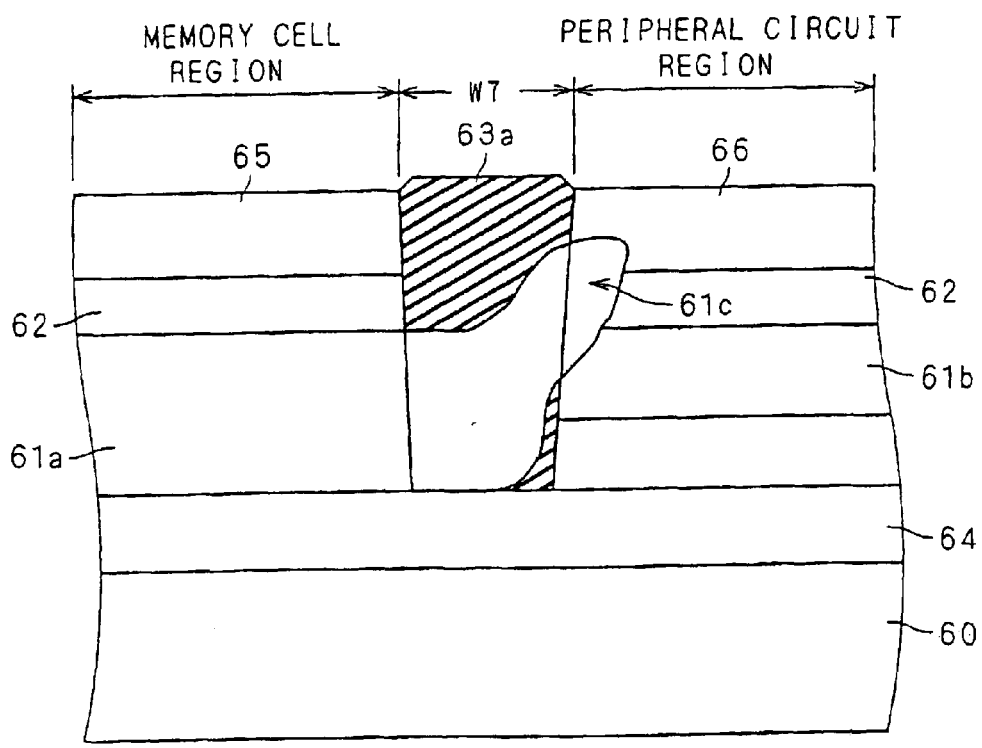
FIG. 15 is a sectional view of a second modification in the sixth preferred embodiment.

FIG. 15 is a sectional view of a semiconductor device structure according to a second modification of the sixth preferred embodiment. This modification is based on the semiconductor device shown in FIG. 13, and characterized in that an STI 63a is formed so deep as to extend from the upper surface of a silicon substrate 60 to the bottom surface of a P well 61a.

Thus, with the second modification of the sixth preferred embodiment, the STI 63a reaches the upper surface of a bottom N well 64. Therefore, the electrons generated in a sense amplifier region are all captured by the bottom N well 64 that is fixed at a plus potential, thus preventing the electrons from diffusing to a memory cell region. Also, there is the advantage that the potential of the P well 61a in the memory cell region and that of the P well 61b in the peripheral circuit region can be set independently.

Seventh Preferred Embodiment

A seventh preferred embodiment is especially directed to a method of making a plurality of element isolation insulating films having different depths, in the methods of manufacturing a semiconductor device according to the first to sixth preferred embodiments. A method of manufacturing a semiconductor device according to the seventh preferred embodiment will be described taking as example the case of forming an FTI and PTI in an upper surface of an SOI substrate.

Figure 16:
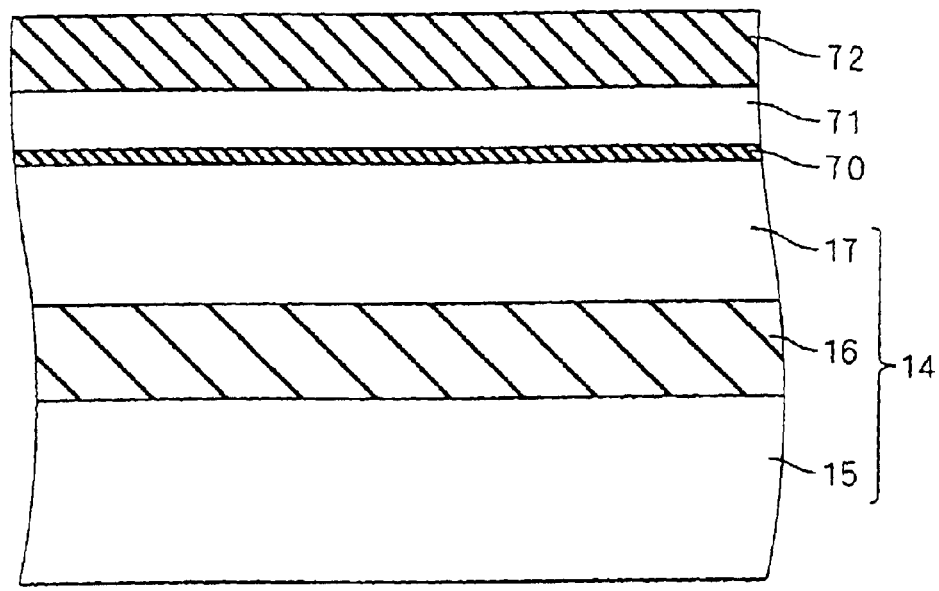
FIGS. 16 to 27 are sectional views illustrating a sequence of processing steps in a method of manufacturing a semiconductor device according to a seventh preferred embodiment.

FIGS. 16 to 27 are sectional views illustrating a sequence of processing steps in a method of manufacturing a semiconductor device according to a seventh preferred embodiment. Referring now to FIG. 16, there is prepared an SOI substrate 14 having a stacked structure in which a silicon substrate 15, BOX layer 16 and silicon layer 17 are stacked in the order named. Then, across the entire surface of the silicon layer 17, a silicon oxide film 70, polysilicon film (or amorphous silicon film) 71, and silicon nitride film 72 are formed in the order named. It should be noted that the polysilicon film 71 is not necessarily required.

Figure 17:
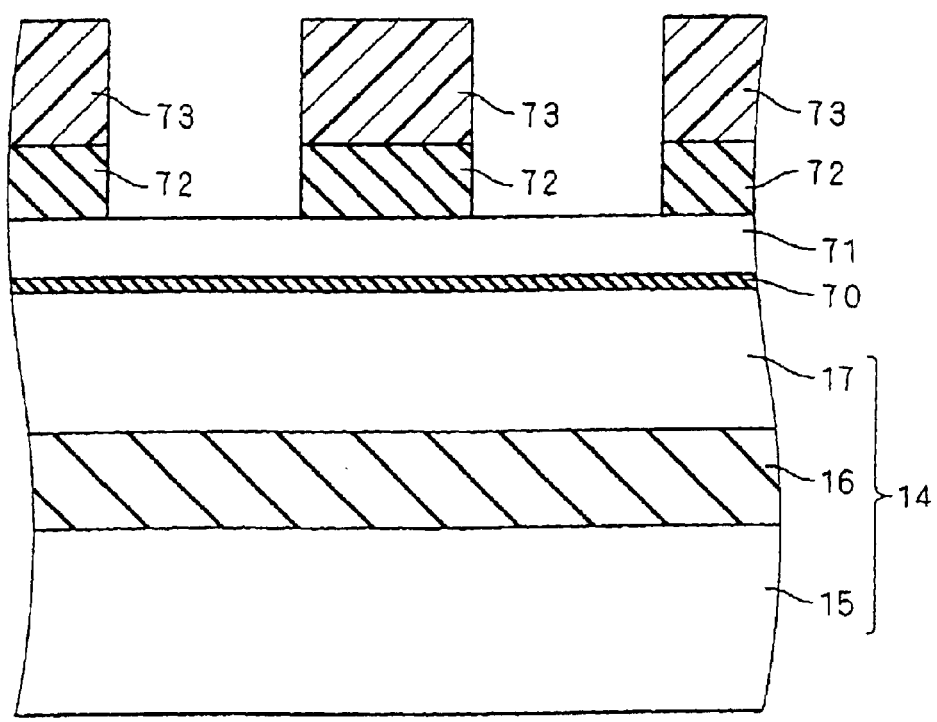
Figure 18:
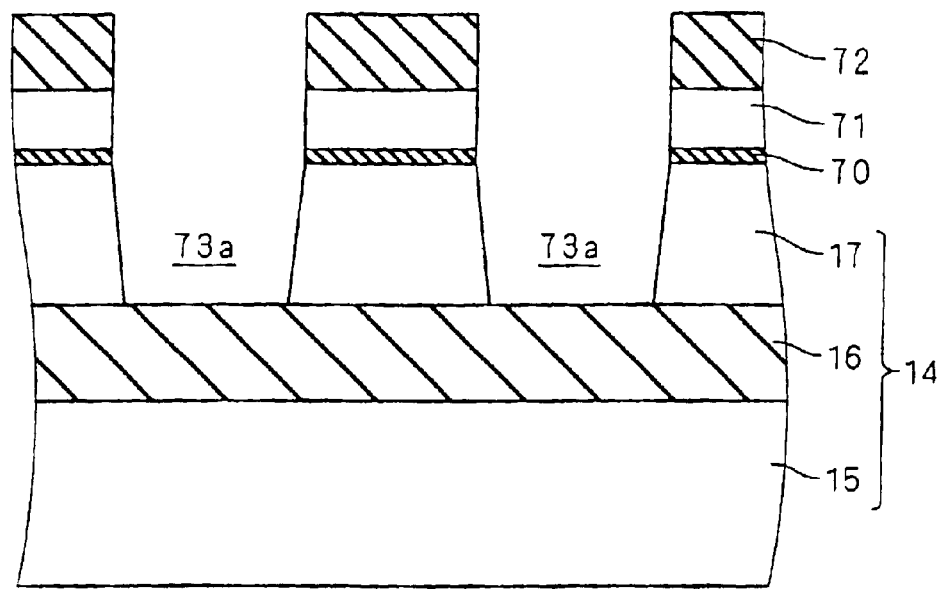

Referring to FIG. 17, a photoresist 73 having an aperture pattern above a prospective region for forming FTI is formed on the silicon nitride film 72. By using the photoresist 73 as an etching mask, the silicon nitride film 72 is removed by etching, to expose the upper surface of the polysilicon film 71. Referring to FIG. 18, after the photoresist 73 is removed, by using the silicon nitride film 72 as an etching mask, the polysilicon film 71, silicon oxide film 70 and silicon layer 17 are removed by etching, in the order named, to expose the upper surface of the BOX layer 16. This results in a recess 73a extending from the upper surface of the silicon layer 17 to the upper surface of the BOX layer 16. In this event, the side wall of the recess 73a is inclined toward the plane of the upper surface of the BOX layer 16 at an angle of about 81° to 89°.

Figure 19:
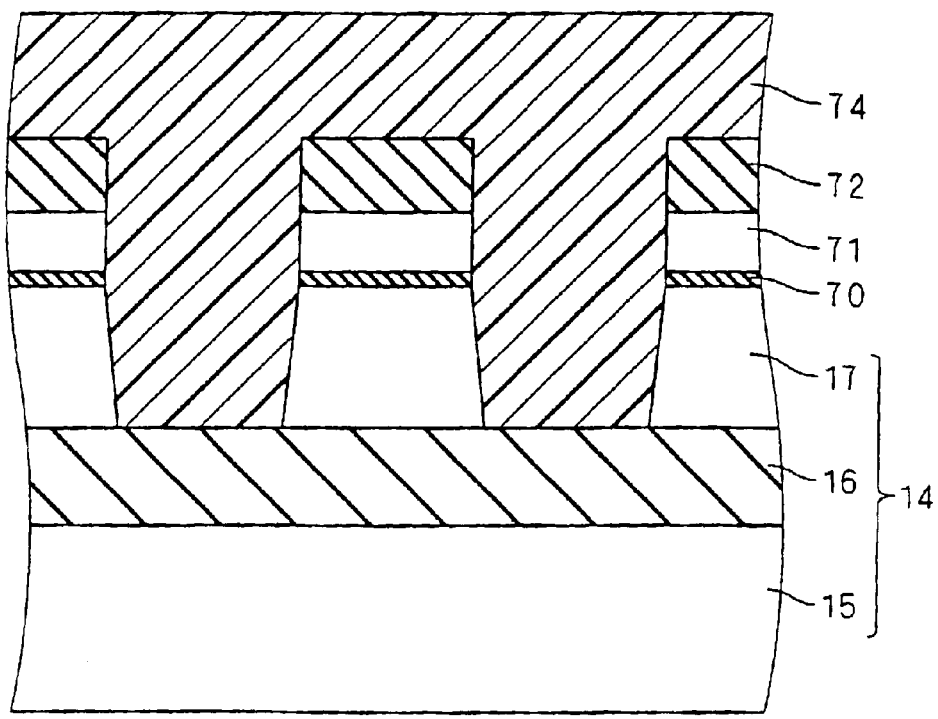
Figure 20:
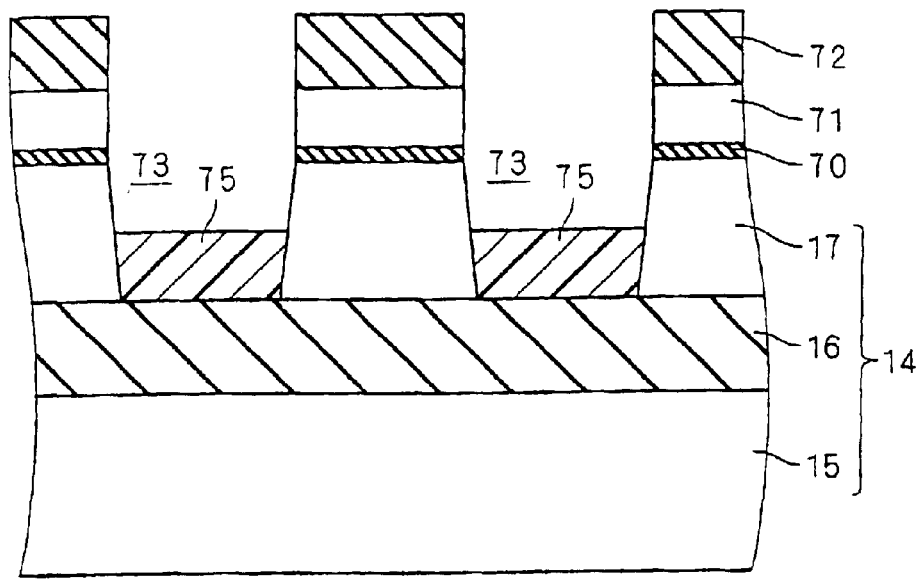

Referring to FIG. 19, a negative type photoresist 74 is applied to the entire surface by spin coating, so as to fill the recess 73a. By means such as of increasing the rotational speed of a spinner, the photoresist 74 is removed such that it remains only in the bottom portion of the recess 73a. The thickness of the photoresist 74 remaining in the recess 73a can be arbitrarily adjusted by the rotational speed or time of the spinner. Referring to FIG. 20, the photoresist 74 remaining in the recess 73a is subjected to exposure and then hardened by post bake, resulting in a photoresist 75.

Instead of the steps shown in FIGS. 19 and 20, the following steps may be conducted. Specifically, a positive type photoresist is applied to the entire surface so as to fill the recess 73a, and the photoresist is subjected to exposure. At this time, the exposure conditions should be adjusted in order that the photoresist remaining in the bottom portion of the recess 73a will not be subjected to exposure. The photoresist after being subjected to exposure is then removed by allowing it to be dissolved in a developer, so that the photoresist is left only in the bottom portion of the recess 73a. Subsequently, the remaining photoresist is hardened by post bake. Even with these steps, it is also possible to obtain a photoresist similar to the photoresist 75 shown in FIG. 20.

Figure 21:
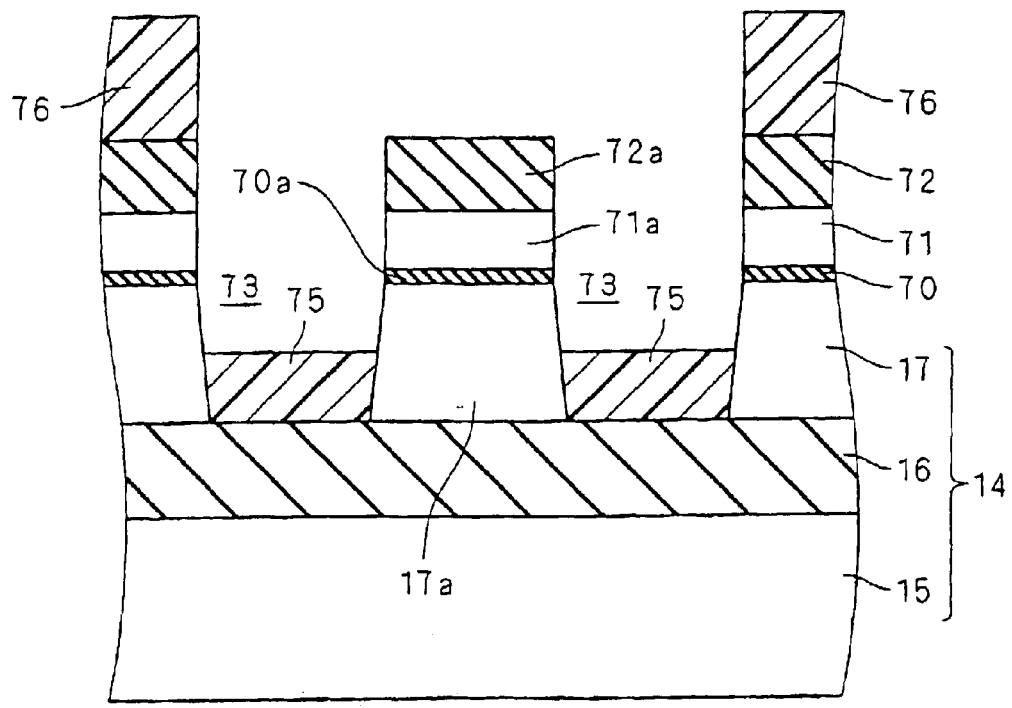

Referring to FIG. 21, a photoresist 76 having an aperture pattern above regions for forming FTI and PTI, is formed on the silicon nitride film 72 by means of a photolithographic process. Since the substrate surface has a difference in level because of the recess 73a, etc., the alignment of a photomask used in forming the photoresist 76 can be performed relatively easily. The alignment accuracy can be further increased by forming a convex or concave type alignment mark on the substrate surface in other region, and performing a photomask alignment by using this alignment mark. For instance, the concave type alignment mark can be formed by performing a selective etching of the substrate surface.

Figure 22:
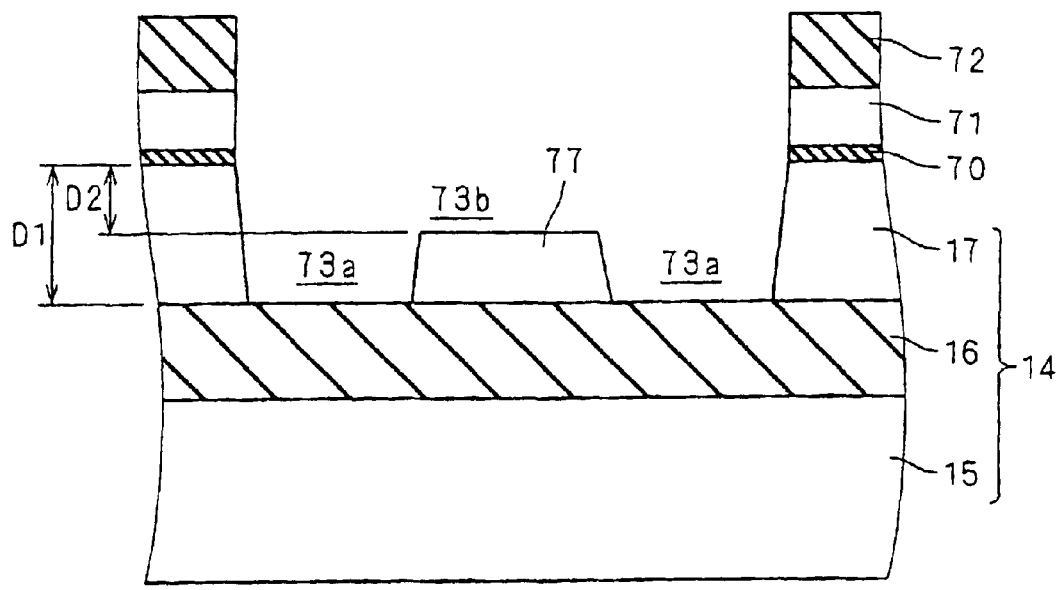

Referring to FIG. 22, by using the photoresist 76 as an etching mask, the silicon nitride film 72a, polysilicon film 71a, silicon oxide film 70a and part of the silicon layer 17a, all of which are exposed from the photoresist 76, are etched in the order named. The silicon layer 17a is etched merely by depth D2 from the upper surface thereof Thereby, a recess 73b is formed in an upper surface of the silicon layer 17 in the prospective region for forming PTI, and a silicon layer 77 is formed as a silicon layer 17a that is left without being etched, beneath the recess 73b. In this event, the hardened photoresist 75 is already disposed on the bottom surface of the recess 73a, and it is thus avoided that the BOX layer 16 and silicon substrate 15 beneath the recess 73a are etched away by the above-mentioned etching. As a result, depth D1 of the FTI from the upper surface of the silicon layer 17 can be kept constant. Also, it is avoided that the BOX layer 16 is damaged by the etching. For instance, it prevents reactive species generated in plasma for etching from being introduced into the BOX layer 16. The photoresists 75 and 76 are then removed.

Figure 23:
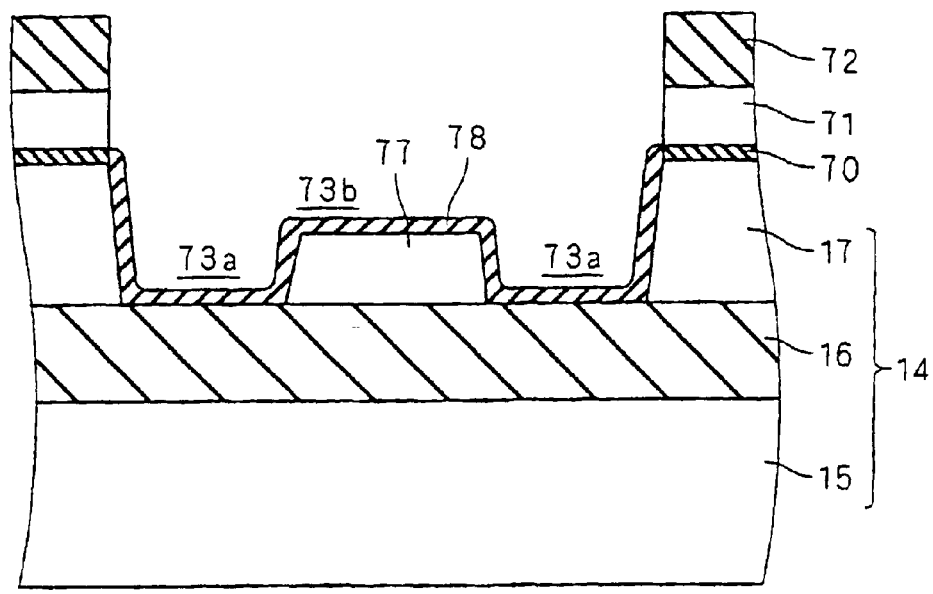

Referring to FIG. 23, the inner walls of the recesses 73a and 73b are subjected to thermal oxidation, to form a silicon oxide film 78. The silicon oxide film 78 absorbs damages, such as breakage, to the silicon layer 17 caused in etching, and also lowers the interface state density between an insulating film to be buried later in the recesses 73a and 73b, and the silicon layer 17 or 77. In place of forming the silicon oxide film 78, other insulating film such as of TEOS (tetraethylorthosilicate), SiN, SiC, SiON, SiOF or SiOC may be formed solely. Alternatively, such films may be combined for forming a multilayer film.

Figure 24:
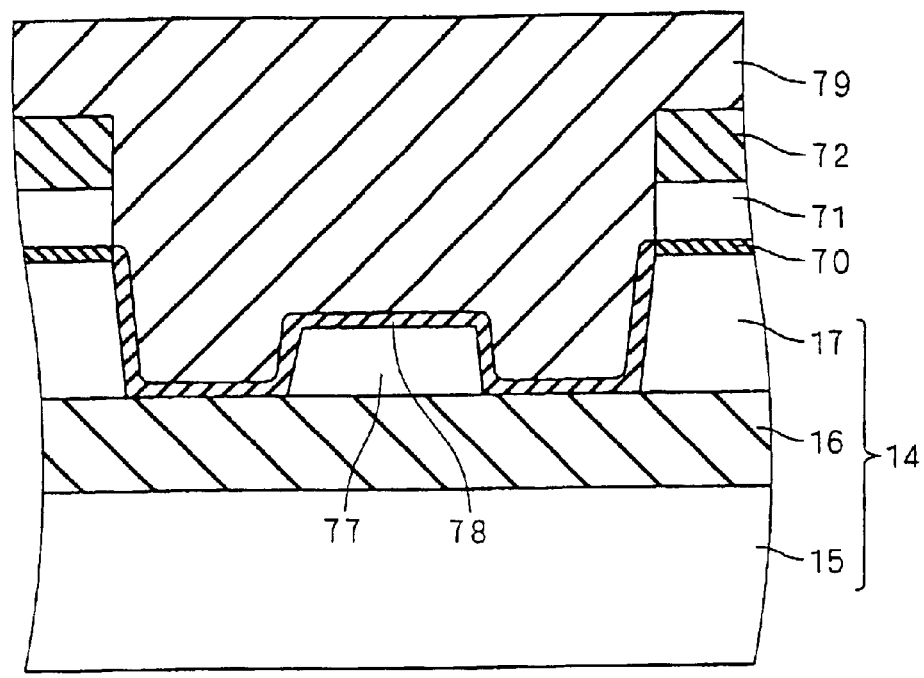

Referring to FIG. 24, a silicon oxide film 79 is formed on the entire surface so as to fill the recesses 73a and 73b. Instead of the silicon oxide film 79, an oxide film such as of TEOS or HDP (dielectrics made by High-Density Plasma), or other insulating film such as of SiON, SiOF, SiOC or SiC, alternatively, a multilayer film in combination of these, may be used for filling the recesses 73a and 73b. Examples of the multilayer constituting insulating films are SiON/TEOS, SiON/HDP oxide film, SiON/SiOF, SiON/SiOC, SiN/TEOS, SiN/HDP oxide film, SiON/SiN/TEOS, SiON/SiN/HDP oxide film, and SiON/SiN/SiOF.

Figure 25:
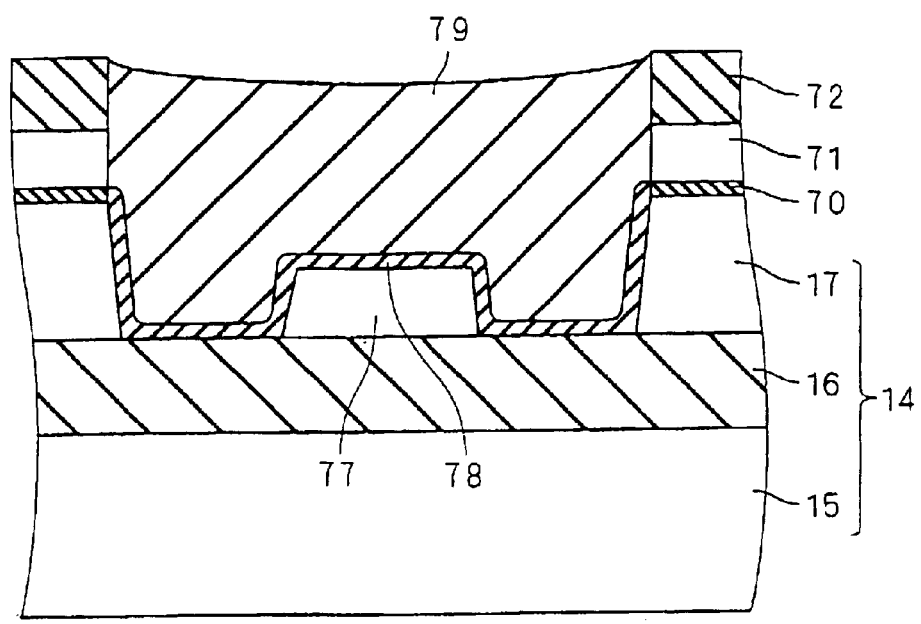
Figure 26:
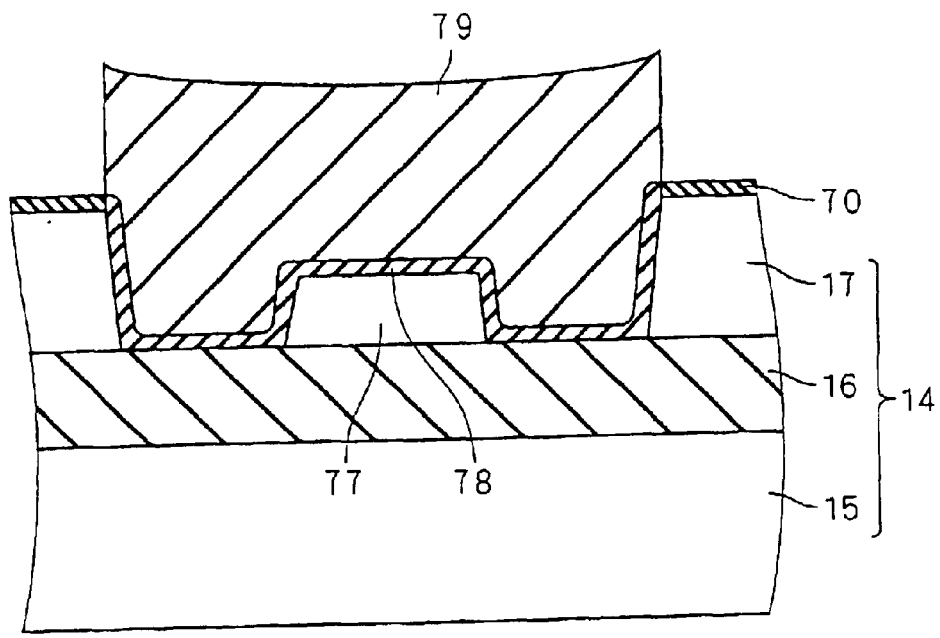
Figure 27:
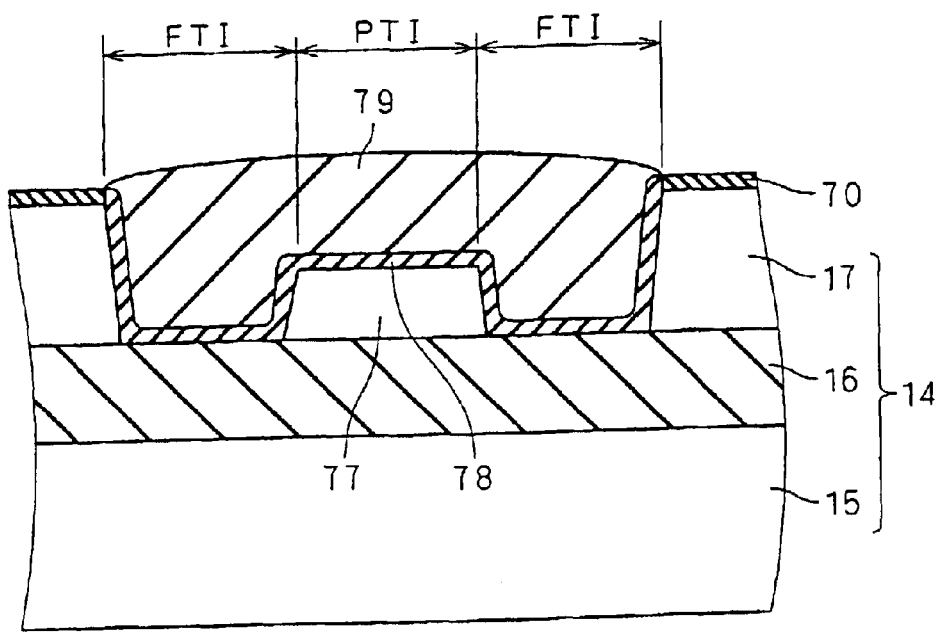
Figure 28:
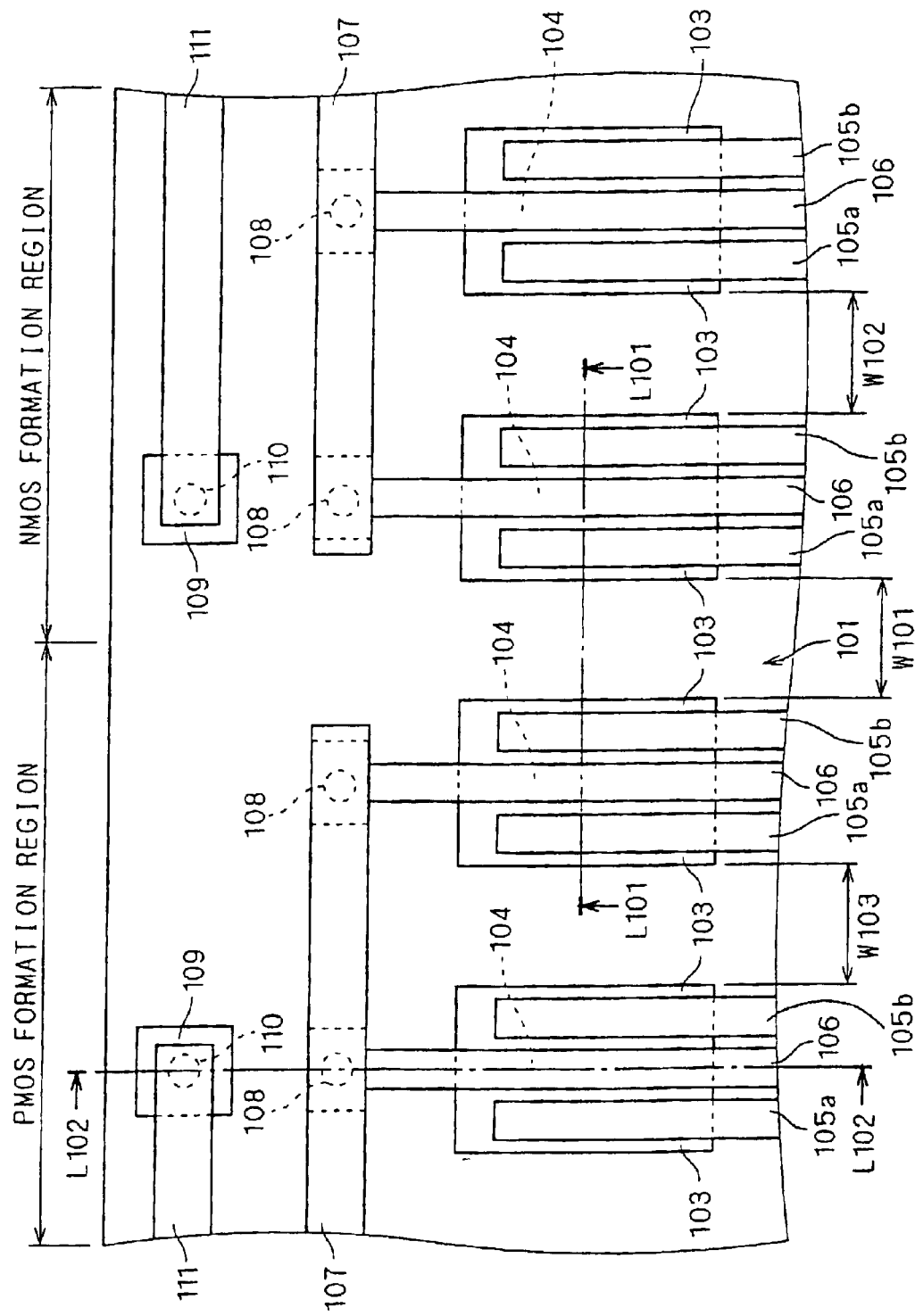
FIG. 28 is a top plan view of a semiconductor device structure according to a conventional technique I.
Figure 29:
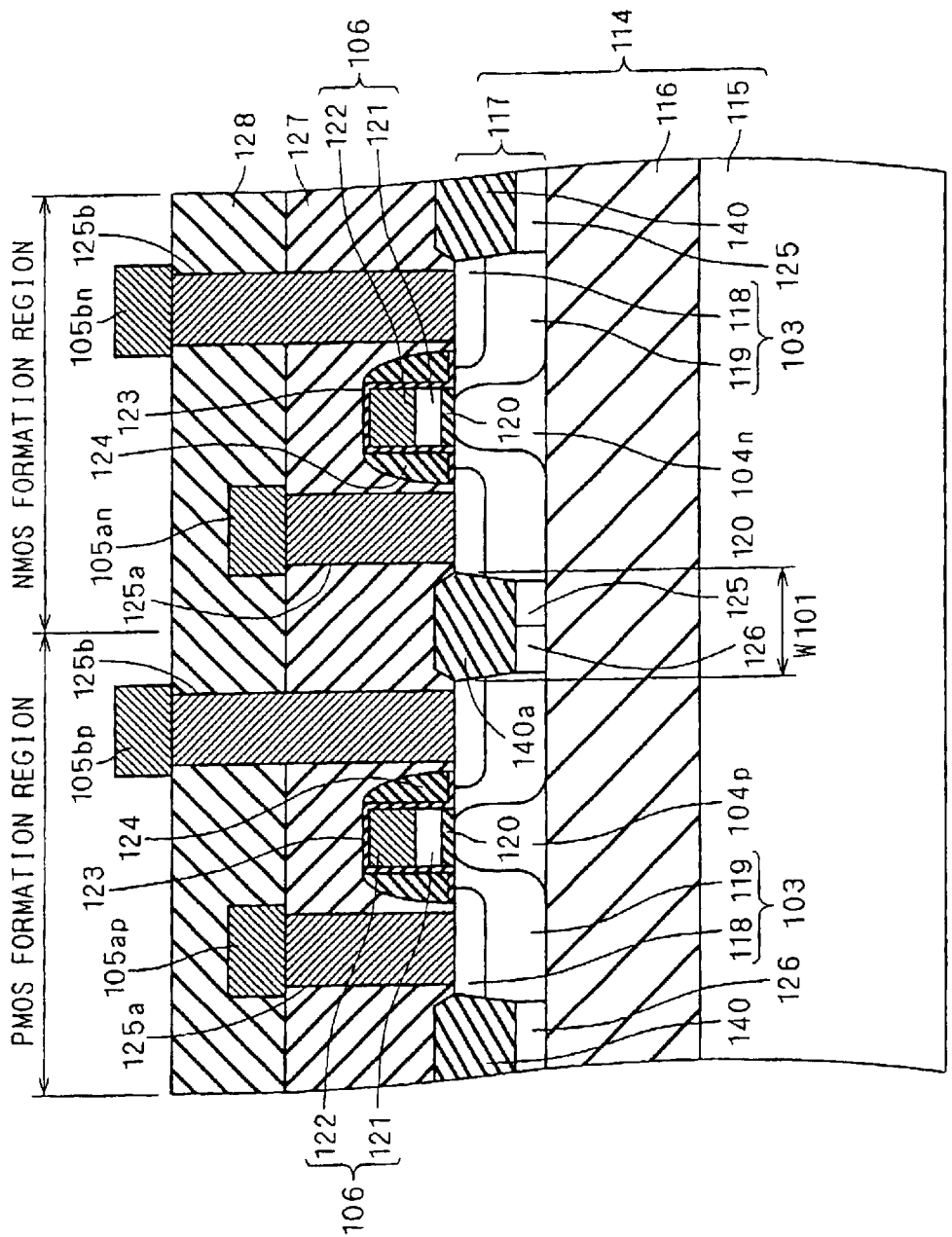
FIG. 29 is a sectional view taken along line L101—L101 in the semiconductor device of FIG. 28.
Figure 30:
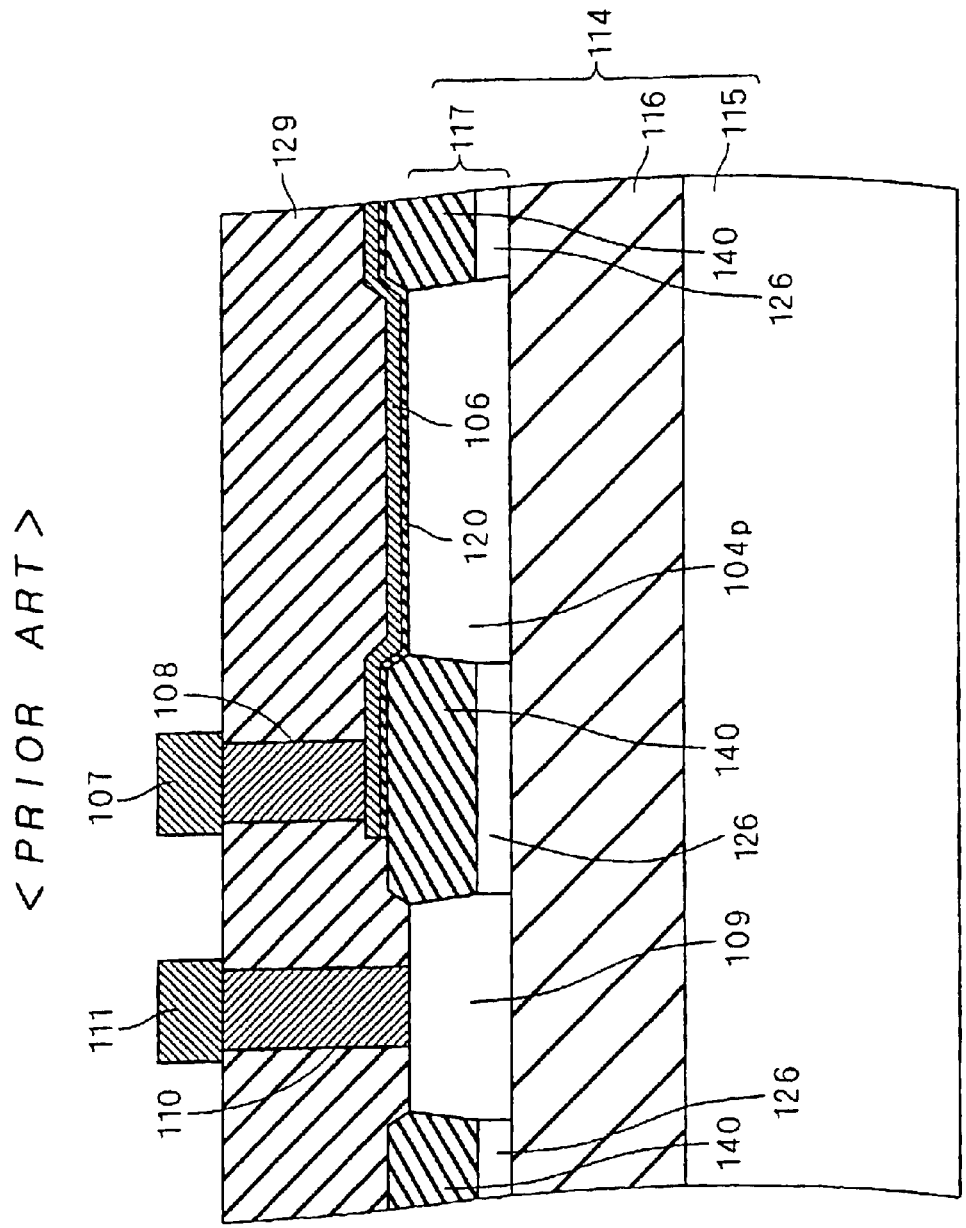
FIG. 30 is a sectional view taken along line L102—L102 in the semiconductor device of FIG. 28.

Referring to FIG. 25, the silicon oxide film 79 is removed by polishing by means of CMP (Chemical Mechanical Polish), until the upper surface of the silicon nitride film 72 is exposed. Referring to FIG. 26, the silicon nitride film 72 and polysilicon film 71 are removed by etching. Referring to FIG. 27, the portion of the silicon oxide film 79 which is located above the upper surface of the silicon oxide film 70 is removed by etching. Thereby, an FTI as a silicon oxide film 79 filling the recess 73a, and a PTI as a silicon oxide film 79 filling the recess 73b, are formed at the same time.

Although the foregoing description is made by taking as example the case of forming the FTI and PTI in an upper surface of the SOI substrate, the method of the seventh preferred embodiment is also applicable to the case that a plurality of STIs having different depths are formed in an upper surface of a bulk substrate. This is attained by the following manner that a recess 73a for deep STI is selectively formed in an upper surface of the bulk substrate; a photoresist 75 is formed on the bottom surface of the recess 73a; a recess 73b for shallow STI is formed in an upper surface of the bulk substrate by etching; and the recesses 73a and 73b are filled with an insulating film. At this time, by the presence of the photoresist 75, it is avoided that the bulk substrate underling the recess 73a is damaged by the etching for forming the recess 73b. Even when a plurality of recesses 73a having different widths are formed in an upper surface of a bulk substrate, the depth of each recess 73a can be kept constant before and after the etching for forming the recess 73b, by the presence of the photoresist 75.

Although the foregoing description in the seventh preferred embodiment is given of the method of manufacturing a semiconductor device of the type in which the upper surfaces of the FTI and PTI are located at a point slightly higher than the upper surface of the silicon layer 17, the present invention is not limited to this type only, but applicable to a semiconductor device of the type in which the upper surfaces of the FTI and PTI are even with the upper surface of the silicon layer 17.

Thus, the method of the seventh preferred embodiment comprises forming a recess 73a in a prospective region for forming FTI; forming a photoresist 75 on the bottom surface of the recess 73a; forming by etching a shallow recess 73b in the prospective region for forming PTI; removing the photoresist 75; and filling the recesses 73a and 73b with a silicon oxide film 79. It is therefore avoided that the BOX layer 16 is also etched or damaged by the etching for forming the recess 73b. In addition, since the recesses 73a and 73b are simultaneously filled with the silicon oxide film 79 in a single step, the manufacturing cost is lowered than the case that the recesses are individually filled in different steps.

Japanese Patent Application Laid-Open No. 7-66284 (1995) discloses a method of manufacturing a semiconductor device comprising the steps, which are performed in the order named, of (a) selectively forming a predetermined mask material on the upper surface of a silicon layer in an SOI substrate; (b) with the predetermined mask material acting as an etching mask, etching the silicon layer until the upper surface of a BOX layer is exposed, thereby to form a trench; (c) forming a photoresist on the bottom surface of the trench; (d) removing the predetermined mask material; (e) removing the photoresist; (f) filling the trench with an insulating film, to form a first element isolation insulating film; and (g) selectively forming a second element isolation insulating film in an upper surface of the silicon layer so as to be shallower than the depth of the trench. This photoresist is provided in order to prevent the upper surface of the BOX layer from being removed when the predetermined mask material is removed, and the photoresist is removed prior to the step (g). With the method disclosed in the above-mentioned publication, the second element isolation insulating film is formed after the step (f) of filing the trench with the insulating film. Accordingly, the method of the seventh preferred embodiment differs from the method of the publication in these points.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a substrate having first and second regions isolated by an element isolation region;

a first element isolation insulating film selectively formed at a first depth in a main surface of said substrate in said first region of said substrate;

a second element isolation insulating film selectively formed at a second depth in said main surface of said substrate in said second region of said substrate;

an impurity introducing region disposed within said substrate only in said first region of said first and second regions of said substrate by performing an ion implantation into said substrate; and a third element isolation insulating film formed in said element isolation region of said substrate so as to extend from said main surface of said substrate to a point deeper than at least said first and second depths, wherein said third element isolation insulating film is formed deeper than a lifted portion of said impurity introducing region disposed within said substrate by performing said ion implantation.

2. The semiconductor device according to claim 1 wherein, said impurity introducing region is a first well of a first conductivity type, said semiconductor device further comprises in said substrate a second well of a second conductivity type different from said first conductivity type, disposed on said first well across said first and second regions, and said third element isolation insulating film extending from said main surface of said substrate to a point deeper than at least an upper surface of said second well.

3. The semiconductor device according to claim 2 wherein said first region is a memory cell region, said second region is a peripheral circuit region, and said first well is a bottom well.

4. The semiconductor device according to claim 2 wherein said third element isolation insulating film extends from said main surface of said substrate and reaches a bottom surface of said second well.

5. The semiconductor device according to claim 4 wherein said first region is a memory cell region, said second region is a peripheral circuit region, and said first well is a bottom well.

* * * * *

UNITED STATES PATENT AND TRADEMARK OFFICE
CERTIFICATE OF CORRECTION

PATENT NO. : 6,762,477 B2
DATED : July 13, 2004
INVENTOR(S) : Kunikiyo

It is certified that error appears in the above-identified patent and that said Letters Patent is hereby corrected as shown below:

<u>Title page,</u>
Item [62], Related U.S. Application Data, should read:

-- Related U.S. Application Data

[62]   Division of application No. 09/667,560, filed on Sep. 22, 2000, now abandoned --

Signed and Sealed this

Sixteenth Day of November, 2004

JON W. DUDAS
*Director of the United States Patent and Trademark Office*